(12) United States Patent
Kao et al.

(10) Patent No.: US 10,943,820 B2
(45) Date of Patent: Mar. 9, 2021

(54) GAP-FILL METHOD HAVING IMPROVED GAP-FILL CAPABILITY

(71) Applicant: Taiwan Semiconductor Manufacturing Co., Ltd., Hsinchu (TW)

(72) Inventors: Wan-Yi Kao, Baoshan Township, Hsinchu County (TW); Wei-Jin Li, Hsinchu (TW); Chung-Chi Ko, Nantou (TW); Yu-Cheng Shiau, Hsinchu (TW); Han-Sheng Weng, Tainan (TW); Chih-Tang Peng, Zhubei (TW); Tien-I Bao, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/414,273

(22) Filed: May 16, 2019

(65) Prior Publication Data
US 2020/0365454 A1 Nov. 19, 2020

(51) Int. Cl.
*H01L 21/768* (2006.01)
*H01L 29/78* (2006.01)
*H01L 29/66* (2006.01)
*H01L 21/8234* (2006.01)
*H01L 27/088* (2006.01)
*H01L 21/02* (2006.01)
*H01L 21/762* (2006.01)

(52) U.S. Cl.
CPC .... *H01L 21/76837* (2013.01); *H01L 21/0228* (2013.01); *H01L 21/02271* (2013.01); *H01L 21/76229* (2013.01); *H01L 21/76232* (2013.01); *H01L 21/823431* (2013.01); *H01L 21/823481* (2013.01); *H01L 27/0886* (2013.01); *H01L 29/66545* (2013.01); *H01L 29/66795* (2013.01); *H01L 29/785* (2013.01); *H01L 21/0214* (2013.01); *H01L 21/02216* (2013.01); *H01L 21/02222* (2013.01); *H01L 21/823437* (2013.01); *H01L 29/7853* (2013.01)

(58) Field of Classification Search
None
See application file for complete search history.

(56) References Cited

U.S. PATENT DOCUMENTS

| | | | |
|---|---|---|---|
| 9,508,604 B1* | 11/2016 | Sung | H01L 21/823821 |
| 2013/0221443 A1* | 8/2013 | Lin | H01L 27/0924 257/368 |
| 2020/0126980 A1* | 4/2020 | Park | H01L 29/06 |

* cited by examiner

*Primary Examiner* — Steven B Gauthier
(74) *Attorney, Agent, or Firm* — Birch, Stewart, Kolasch & Birch, LLP

(57) ABSTRACT

A method for forming a semiconductor structure is provided. The method includes patterning a semiconductor substrate to form a first semiconductor fin and a second semiconductor fin adjacent to the first semiconductor fin, and depositing a first dielectric material on the first semiconductor fin and the second semiconductor fin on the semiconductor substrate using an atomic layer deposition process. There is a first trench between the first semiconductor fin and the second semiconductor fin. The method also includes filling the first trench with a flowable dielectric material, and heating the flowable dielectric material and the first dielectric material to form an isolation structure between the first semiconductor fin and the second semiconductor fin.

20 Claims, 25 Drawing Sheets

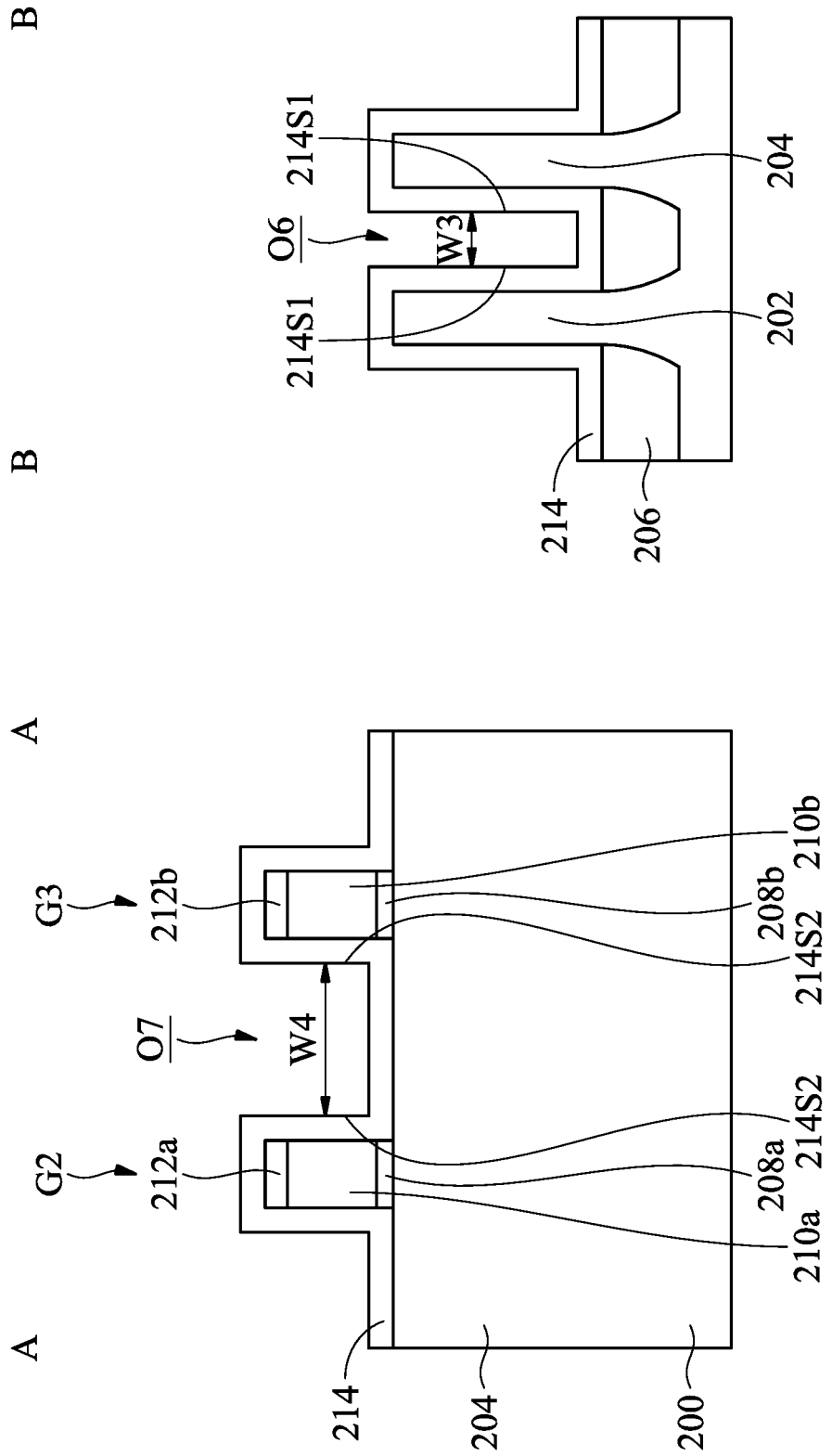

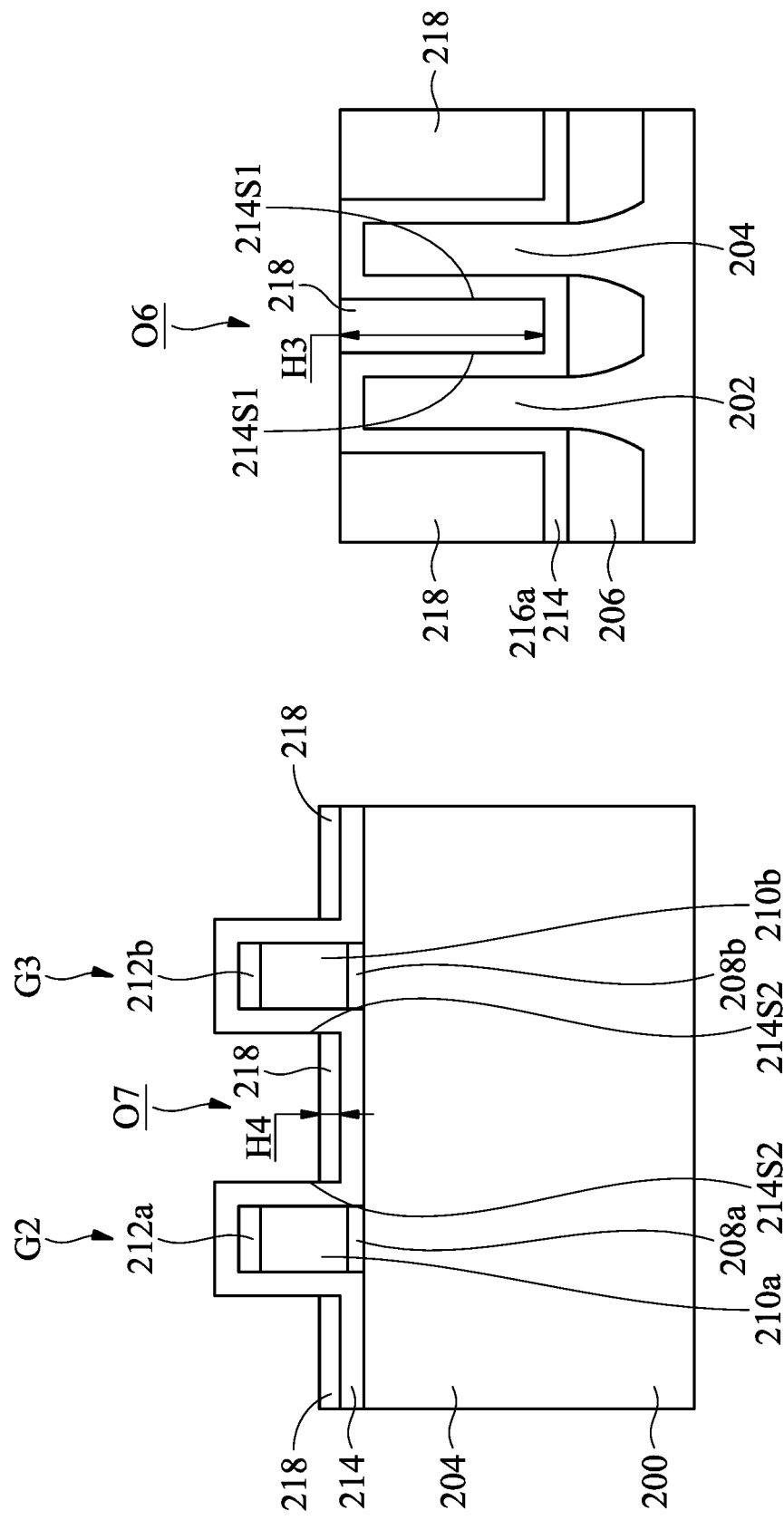

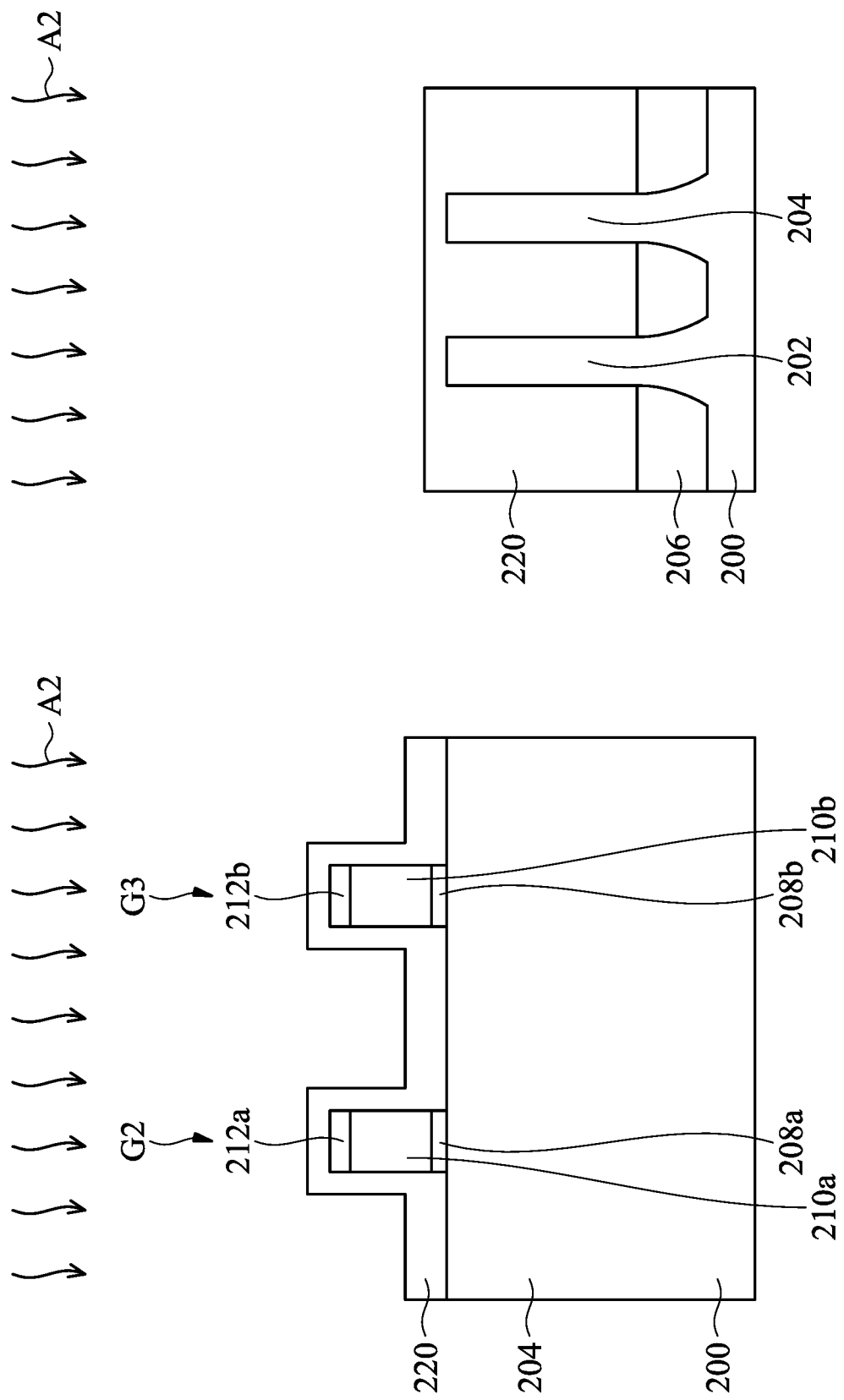

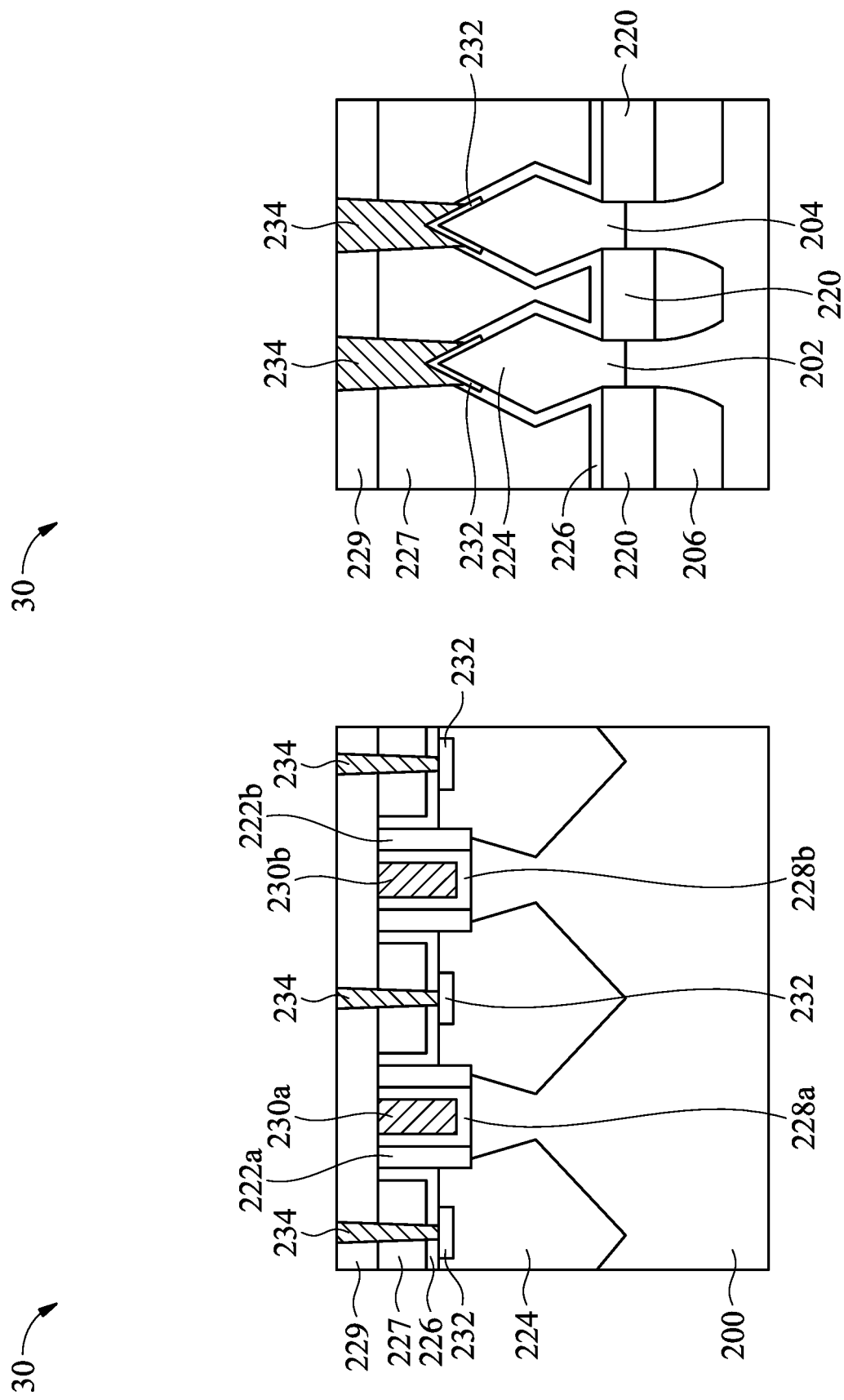

GAP-FILL METHOD HAVING IMPROVED GAP-FILL CAPABILITY

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

Although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-2, 1B-2, 1C-2, 1D-2, 1E-2, and 1F-2 are a series of cross-sectional views taken along line X1-X2 shown in FIGS. 1A-1, 1B-1, 1C-1, 1D-1, 1E-1, and 1F-1.

FIG. 2 is a perspective view illustrating a stage of a method for forming a semiconductor structure in accordance with some embodiments.

FIGS. 3A-1, 3B-1, 3C-1, 3D-1, 3E-1, 3F-1, and 3G-1 are a series of cross-sectional views which are taken along line A-A of FIG. 2 and illustrate various stages of a method for forming a semiconductor structure in accordance with some embodiments.

FIGS. 3A-2, 3B-2, 3C-2, 3D-2, 3E-2, 3F-2, and 3G-2 are a series of cross-sectional views which are taken along line B-B of FIG. 2 and illustrate various stages of a method for forming a semiconductor structure in accordance with some embodiments.

DETAILED DESCRIPTION

Figures 1, 1A:
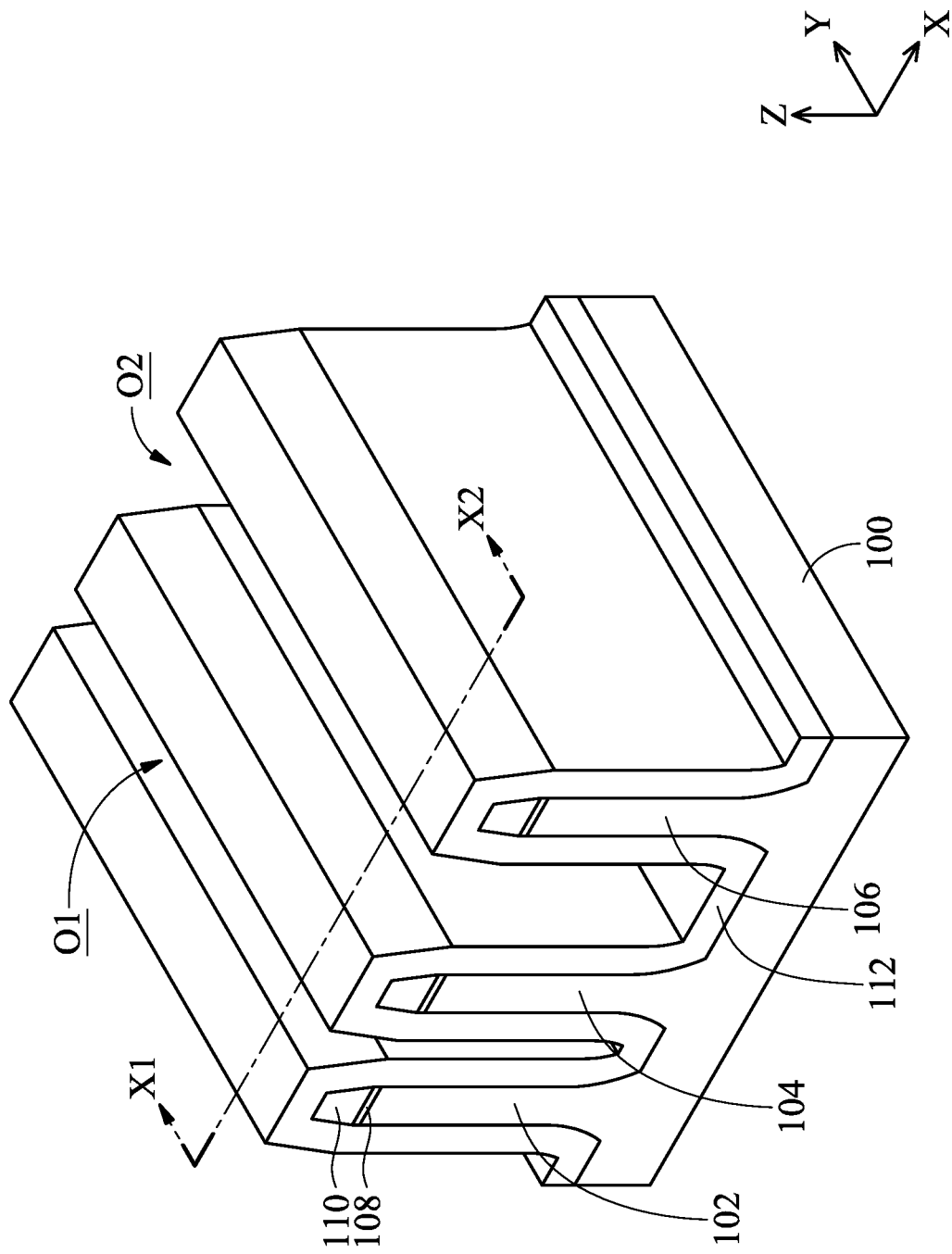
FIGS. 1A-1, 1B-1, 1C-1, 1D-1, 1E-1, 1F-1, 1G, 1H, 1I, 1J, and 1K are a series of perspective views illustrating various stages of a method for forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Fin structures (e.g., semiconductor fins) described below may be patterned using any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of methods for forming semiconductor structures are provided. The method may include forming a first dielectric material on a first semiconductor fin and a second semiconductor fin, and forming a second dielectric material to fill a trench between the first semiconductor fin and the second semiconductor fin. The second dielectric material may be a flowable dielectric material, so that an isolation structure formed by heating the first dielectric material and the second dielectric material may have an improved gap-fill capability to fill the trench between the first semiconductor fin and the second semiconductor fin.

FIGS. 1A-1, 1B-1, 1C-1, 1D-1, 1E-1, 1F-1, 1G, 1H, 1I, 1J, and 1K are a series of perspective views illustrating various stages of a method for forming a semiconductor structure in accordance with some embodiments of the present disclosure. FIGS. 1A-2, 1B-2, 1C-2, 1D-2, 1E-2, and 1F-2 are a series of cross-sectional views taken along line X1-X2 shown in FIGS. 1A-1, 1B-1, 1C-1, 1D-1, 1E-1, and 1F-1.

Figures 1, 1A, 2:
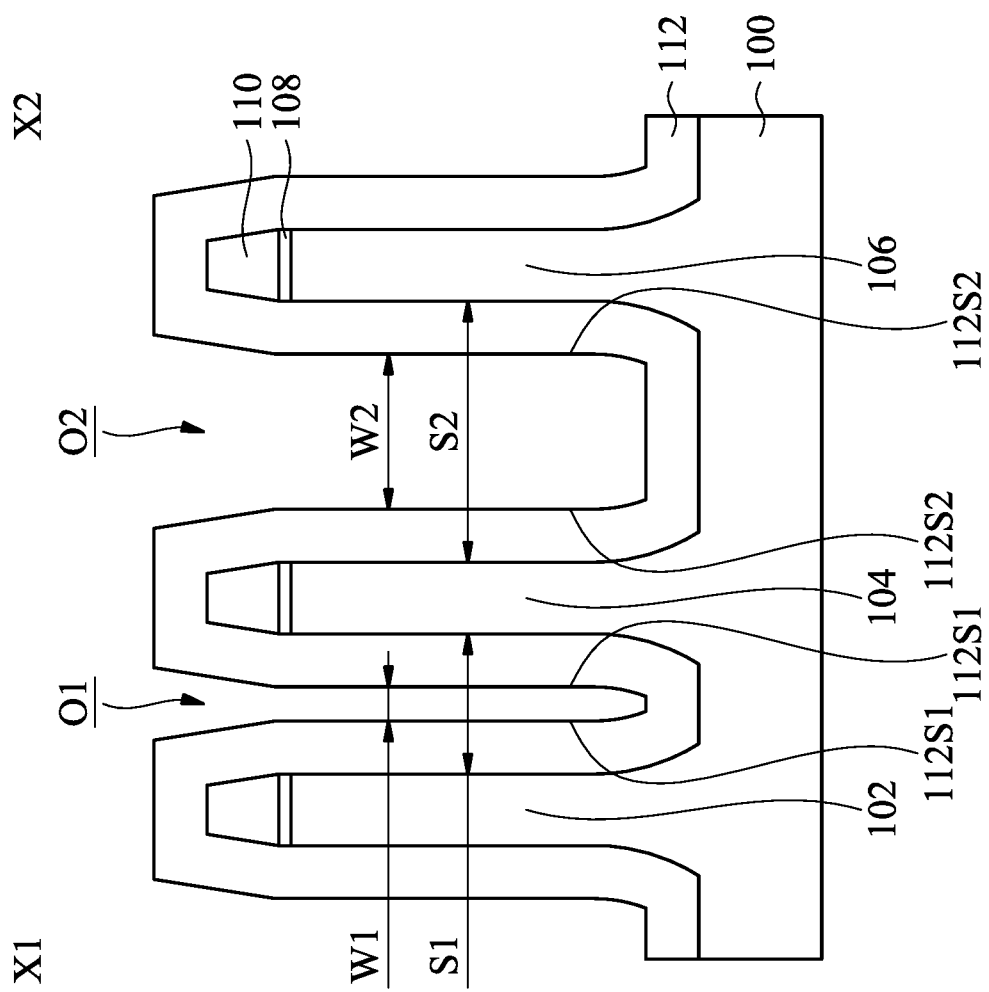

A semiconductor substrate 100 is provided, as shown in FIGS. 1A-1 and 1A-2 in accordance with some embodiments. The semiconductor substrate 100 may be a semiconductor wafer such as a silicon wafer. The semiconductor substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the semiconductor substrate 100 includes an epitaxial layer. For example, the semiconductor substrate 100 may have an epitaxial layer overlying a bulk semiconductor. In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable process, or a combination thereof.

Various active elements (not shown) may be formed in and/or over the semiconductor substrate 100. Examples of the various active elements include transistors, diodes, another applicable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs). In some embodiments, the semiconductor substrate 100 includes a fin field effect transistor (FinFET). Various passive elements (not shown) may be formed in and/or over the semiconductor substrate 100. Examples of the various passive elements include capacitors, inductors, resistors, another applicable passive element, or a combination thereof. Various processes, such as front-end-of-line (FEOL) semiconductor fabrication processes, may be performed to form the various active elements and passive elements. The FEOL semiconductor fabrication processes may include deposition, etching, implantation, lithography, annealing, planarization, one or more other applicable processes, or a combination thereof.

Afterwards, the semiconductor substrate 100 is patterned to form semiconductor fins 102, 104 and 106, as shown in FIGS. 1A-1 and 1A-2 in accordance with some embodiments. The semiconductor fins 102, 104 and 106 may protrude from the semiconductor substrate 100 along a direction Z perpendicular to the top surface of the semiconductor substrate 100, as shown in FIG. 1A-1. The semiconductor fins 102, 104 and 106 may extend along a direction Y, as shown in FIG. 1A-1, and the direction Y may be the lengthwise direction of the semiconductor fins 102, 104 and 106. A direction X may be perpendicular to the direction Y, and the direction X may be the widthwise direction of the semiconductor fins 102, 104 and 106.

In some embodiments, the semiconductor fins 102, 104 and 106 have tapered sidewalls. For example, each of the semiconductor fins 102, 104 and 106 may have a width that gradually increases from the top portion to the lower portion.

The semiconductor fin 102 and the semiconductor fin 104 may be spaced a distance S1 apart, and the semiconductor fin 104 and the semiconductor fin 106 may be spaced a distance S2 apart, as shown in FIG. 1A-2. In some embodiments, distance S2 is greater than distance S1.

In some embodiment, before the semiconductor substrate 100 is patterned, a first mask layer 108 and a second mask layer 110 are successively formed over the semiconductor substrate 100. In some embodiments, the first mask layer 108 serves a buffer layer or an adhesion layer that is formed between the underlying semiconductor substrate 100 and the overlying second mask layer 110. The first mask layer 108 may also be used as an etch stop layer when the second mask layer 110 is removed or etched.

In some embodiments, the first mask layer 108 is made of silicon oxide. In some embodiments, the first mask layer 108 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on coating process, another applicable process, or a combination thereof.

In some embodiments, the second mask layer 110 is made of silicon oxide, silicon nitride, silicon oxynitride, another applicable material, or a combination thereof. In some embodiments, the second mask layer 110 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on coating process, another applicable process, or a combination thereof.

In some embodiments, after the formation of the first mask layer 108 and the second mask layer 110, the first mask layer 108 and the overlying second mask layer 110 are patterned by a photolithography process and an etching process, so as to expose portions of the semiconductor substrate 100. For example, the photolithography process may include photoresist coating (e.g., spin-on coating), soft baking, mask aligning, exposure, post-exposure baking, developing the photoresist, rinsing and drying (e.g., hard baking). Moreover, the etching process may be a dry etching process, such as a reactive ion etching (RIE) process, a neutral beam etching (NBE) process, the like, or a combination thereof.

Afterwards, an etching process is performed on the semiconductor substrate 100 to form the semiconductor fins 102, 104 and 106 by using the patterned first mask layer 108 and the patterned second mask layer 110 as an etch mask, in accordance with some embodiments. In some embodiments, the etching process includes a dry etching process, a wet etching process, or a combination thereof. In some embodiments, the semiconductor substrate 100 is etched by a dry etching process, such as an RIE process, an NBE process, the like, or a combination thereof. The dry etching process may be performed using a process gas including fluorine-based etchant gas. For example, the process gas may include $SF_6$, $C_xF_y$ (x and y are both integers), $NF_3$, or a combination thereof.

Afterwards, a first dielectric material 112 is formed on the semiconductor substrate 100, as shown in FIGS. 1A-1 and 1A-2 in accordance with some embodiments. In some embodiments, the first dielectric material 112 is conformally formed on the semiconductor fins 102, 104 and 106, as shown in FIGS. 1A-1 and 1A-2. The first dielectric material 112 may line the sidewalls and the top surfaces of the semiconductor fins 102, 104 and 106, and may line the top surface of the semiconductor substrate 100 between any two of the semiconductor fins 102, 104 and 106.

In some embodiments, there is a trench (or gap) O1 between the semiconductor fins 102 and 104, and there is a trench O2 between the semiconductor fins 104 and 106, as shown in FIGS. 1A-1 and 1A-2. The trench O1 may be defined by sidewalls 112S1 of the first dielectric material 112 between the semiconductor fins 102 and 104, and the trench O2 may be defined by sidewalls 112S2 of the first dielectric material 112 between the semiconductor fins 104 and 106. The trench O1 may have a width W1, and the trench O2 may have a width W2, as shown in FIG. 1A-2. In some embodiments, the width W1 of the trench O1 is smaller than the width W2 of the trench O2.

In some embodiments, the first dielectric material 112 includes silicon, oxygen, nitrogen, hydrogen, carbon, or a combination thereof. In some embodiments, the first dielectric material 112 includes silicon oxycarbonitride (SiOCN).

The first dielectric material 112 may be formed by a deposition process performed in a deposition chamber. The deposition process for forming the first dielectric material 112 is an atomic layer deposition (ALD) process, in accordance with some embodiments.

In some embodiments, the atomic layer deposition process may be performed in an atomic layer deposition chamber at a deposition temperature T1 in a range from about 500° C. to about 700° C. The deposition temperature T1 may be adjusted to improve the quality (e.g., the surface roughness) of the first dielectric material 112.

In some embodiments, the atomic layer deposition process for forming the first dielectric material 112 includes sequentially flowing a silicon source precursor, a nitrogen and carbon source precursor, and an oxygen source precursor into an atomic layer deposition chamber in multiple cycles. Each cycle of the atomic layer deposition process for forming the first dielectric material 112 may include alternating flow (or pulse) and purge operations, where each precursor is flowed (or pulsed) and subsequently purged at least once during the cycle.

Each cycle of the ALD process for forming the dielectric material 112 may include several operations. In some embodiments, each cycle of the ALD process for forming the dielectric material 112 includes a first operation where the silicon source precursor is flowed into an ALD chamber. The silicon source precursor may be flowed into an ALD chamber having a substrate to be processed, for example, the semiconductor substrate 100 with the semiconductor fins 102, 104 and 106. The silicon source precursor may react with the surfaces of the semiconductor substrate 100 and the semiconductor fins 102, 104 and 106, such that a first intermediate film is formed. For example, the silicon source precursor may be hexachlorodisilane (HCD, $Si_2Cl_6$), another applicable material, or a combination thereof.

In some embodiments, each cycle of the ALD process for forming the dielectric material 112 includes a second operation where the ALD chamber is purged to remove by-products and unconsumed silicon source precursor in the first operation from the ALD chamber.

In some embodiments, each cycle of the ALD process for forming the dielectric material 112 includes a third operation where a nitrogen and carbon source precursor is flowed into the ALD chamber. For example, the nitrogen and carbon source precursor may include Triethylamine ($N(C_2H_5)_3$, also known as RENA), another applicable material, or a combination thereof. The nitrogen and carbon source precursor may decompose in the ALD chamber and react with the first intermediate film, such that a second intermediate film is formed.

In some embodiments, each cycle of the ALD process for forming the dielectric material 112 includes a fourth operation where the ALD chamber is purged to remove by-products and unconsumed nitrogen and carbon source precursor in the third operation from the ALD chamber.

In some embodiments, each cycle of the ALD process for forming the dielectric material 112 includes a fifth operation where an oxygen source precursor is flowed into the ALD chamber. For example, the oxygen source precursor may include oxygen gas ($O_2$). The oxygen source precursor may react with the second intermediate film, such that a third intermediate film is formed.

In some embodiments, each cycle of the ALD process for forming the dielectric material 112 includes a sixth operation where the ALD chamber is purged to remove by-products and unconsumed oxygen source precursor in the fifth operation from the ALD chamber.

One cycle of the ALD process for forming the dielectric material 112 may include the first to sixth operations discussed above. After the sixth operation, a determination with respect to whether additional cycles are to be performed may be made. If so, another cycle may be performed. Any number of cycles may be performed to obtain the first dielectric material 112 with a desired thickness. If no additional cycles are needed, the ALD process can be concluded.

Figures 1, 1B:
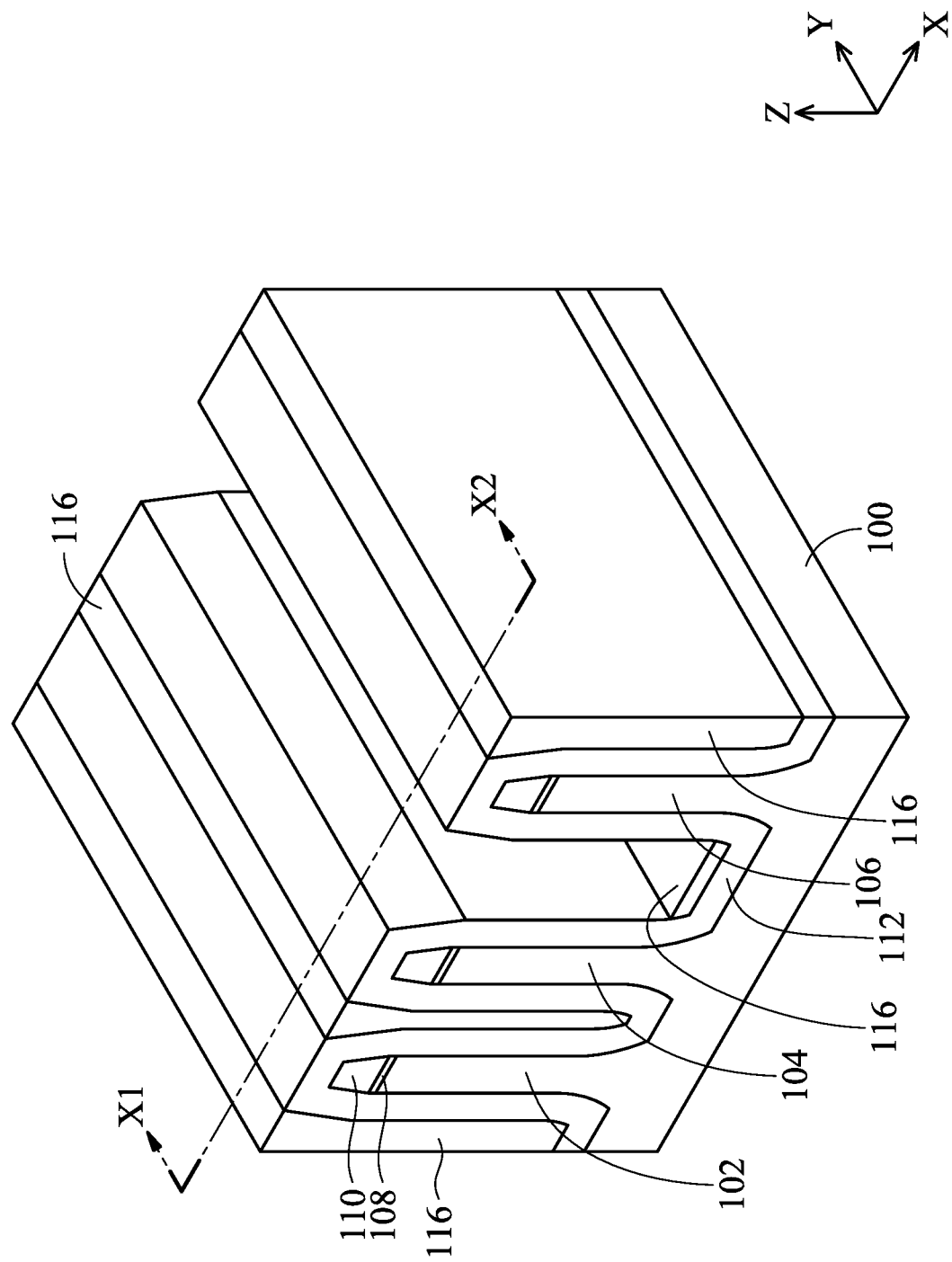
Figures 1, 1B, 2:
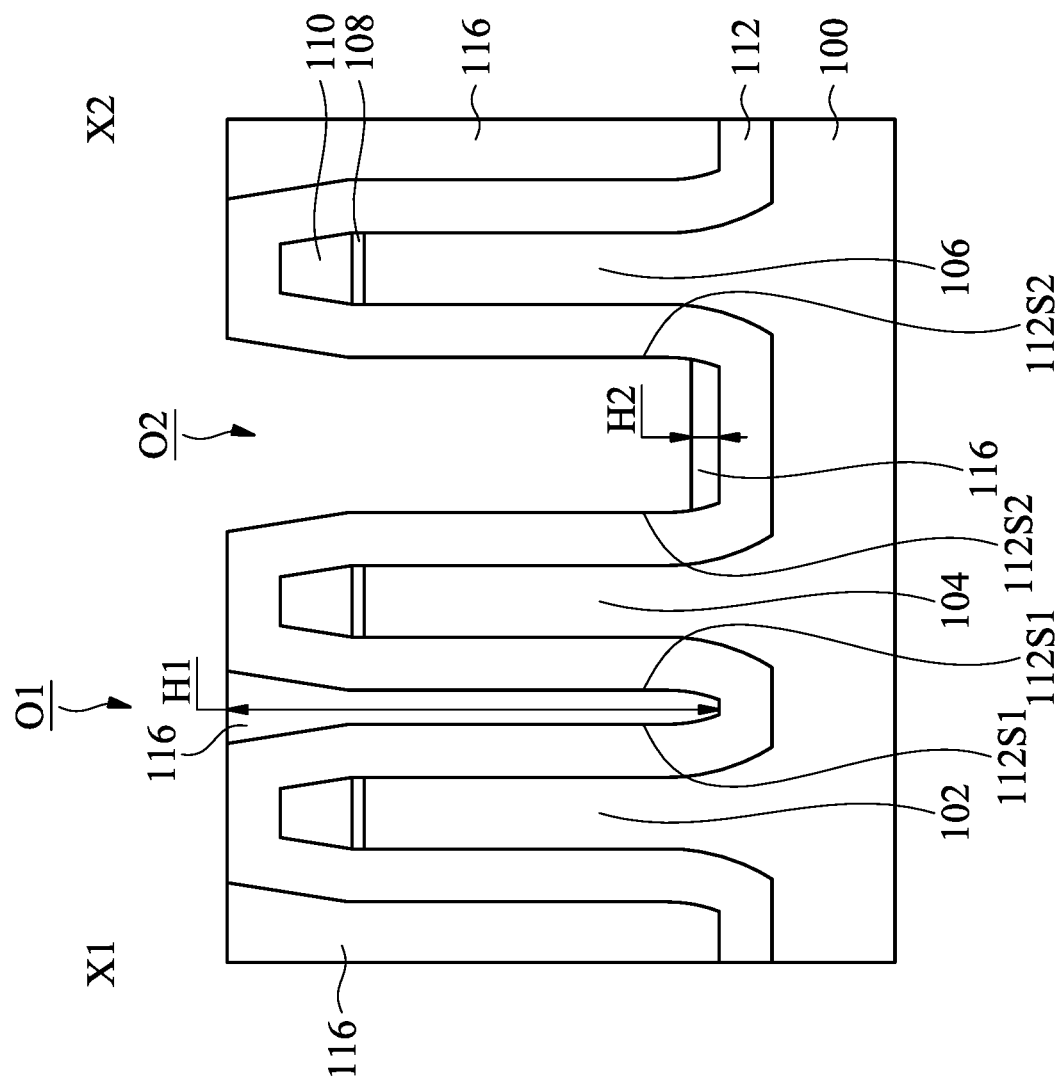

Afterwards, a second dielectric material 116 is formed on the first dielectric material 112, as shown in FIGS. 1B-1 and 1B-2 in accordance with some embodiments. In some embodiments, the trench O1 between the semiconductor fin 102 and the semiconductor fin 104 is filled with a portion of the second dielectric material 116, as shown in FIGS. 1B-1 and 1B-2.

In some embodiments, a portion of the second dielectric material 116 is formed on the first dielectric material 112 between the semiconductor fins 104 and 106. In some embodiments, since the width W2 of the trench O2 is greater than the width W1 of the trench O1, the thickness H1 of the portion of the second dielectric material 116 that is between the sidewalls 11251 of the first dielectric material 112 is greater the thickness H2 of the portion of the second dielectric material 116 that is between the sidewalls 11252 of the first dielectric material 112. In some embodiments, the top region of the trench O2 remains unfilled after the formation of the second dielectric material 116.

In some embodiments, the second dielectric material 116 is a flowable dielectric material, so that it has an improved gap-fill capability to fill the trench O1 having a small size (e.g., the width W1 of the trench O1 may be in a range from about 0.1 nm to about 5 nm).

Flowable dielectric materials, as their name suggests, can "flow" during deposition to fill gaps or spaces with a high aspect ratio. For example, the flowable dielectric material may include polysilazane, triethylamine, another applicable material, or a combination thereof.

In some embodiments, the second dielectric material 116 is or includes a flowable dielectric material formed by a flowable chemical vapor deposition (FCVD) process. In some embodiments, in the flowable chemical vapor deposition process for forming the second dielectric material 116, various chemistries are added to silicon-containing precursors to allow the deposited second dielectric material 116 to flow.

In some embodiments, in the flowable chemical vapor deposition process for forming the second dielectric material 116, the precursor of the second dielectric material 116 includes a silicate, a siloxane, a methyl silsesquioxane (MSQ), a hydrogen silsesquioxane (HSQ), a perhydrosilazane (TCPS), a perhydro-polysilazane (PSZ), a tetraethyl orthosilicate (TEOS), a silyl-amine (e.g., trisilylamine (TSA)), or a combination thereof.

In some embodiments, in the flowable chemical vapor deposition process for forming the second dielectric material 116, a plasma is induced to react the precursor of the second dielectric material 116 to form oligomers by a gas phase reaction, and then the oligomers deposit on the first dielectric material 112 to form the second dielectric material 116.

The oligomers may have a low molecular weight. For example, the number-average molecular weight of the oligomers of the second dielectric material 116 may be in a range from about 50 to about 150. The number-average molecular weight of the oligomers may be adjusted, so that it is easier for the oligomers to enter the trench O1 between the semiconductor fins 102 and 104, improving the gap-fill capability of the second dielectric material 116 with respect to the trench O1.

The viscosity of the second dielectric material 116 may be in a range from about 0.1 centipoise to about 2. The viscosity of the second dielectric material 116 may be adjusted, so that the gap-fill capability of the second dielectric material 116 to fill the trench O1 defined by the sidewalls 112S1 of the first dielectric material 112 formed in an atomic layer deposition process may be improved.

In some embodiments, the second dielectric material 116 includes silicon, oxygen, nitrogen, hydrogen, carbon, or a combination thereof. In some embodiments, the carbon content of the second dielectric material 116 is lower than the carbon content of the first dielectric material 112. For example, the carbon content of the first dielectric material 112 may be in a range from about 0.1 w.t. % to about 1 w.t. %. For example, the carbon content of the second dielectric material 116 may be in a range from about 0.1 w.t. % to about 1 w.t. %. In some embodiments, the second dielectric material 116 is substantially free of carbon. By adjusting the carbon content of the second dielectric material 116, the viscosity of the second dielectric material 116 may be adjusted to improve the gap-fill capability of the second dielectric material 116 with respect to the trench O1 having a small size (e.g., the width W1 may be in a range from about 0.1 nm to about 5 nm).

The dielectric constant of the second dielectric material 116 may be in a range from about 2 to about 5. The dielectric constant of the second dielectric material 116 may be adjusted to improve the electrical performance of a semiconductor structure (e.g., the semiconductor structure 10 illustrated in FIG. 1K) including the semiconductor fins 102 and 104.

In some embodiments, the trench O1 with a small size (e.g., the width W1 of the trench O1 being in a range from about 0.1 nm to about 5 nm) is filled by a bottom-up deposition of the second dielectric material 116 without clogging at the top of the trench O1, reducing defects (e.g. voids or seams) of an isolation structure (e.g., the isolation structure 118 which will be discussed in the following paragraphs) formed from the first dielectric material 112 and the second dielectric material 116 between the semiconductor fins 102 and 104.

Figures 1, 1C:
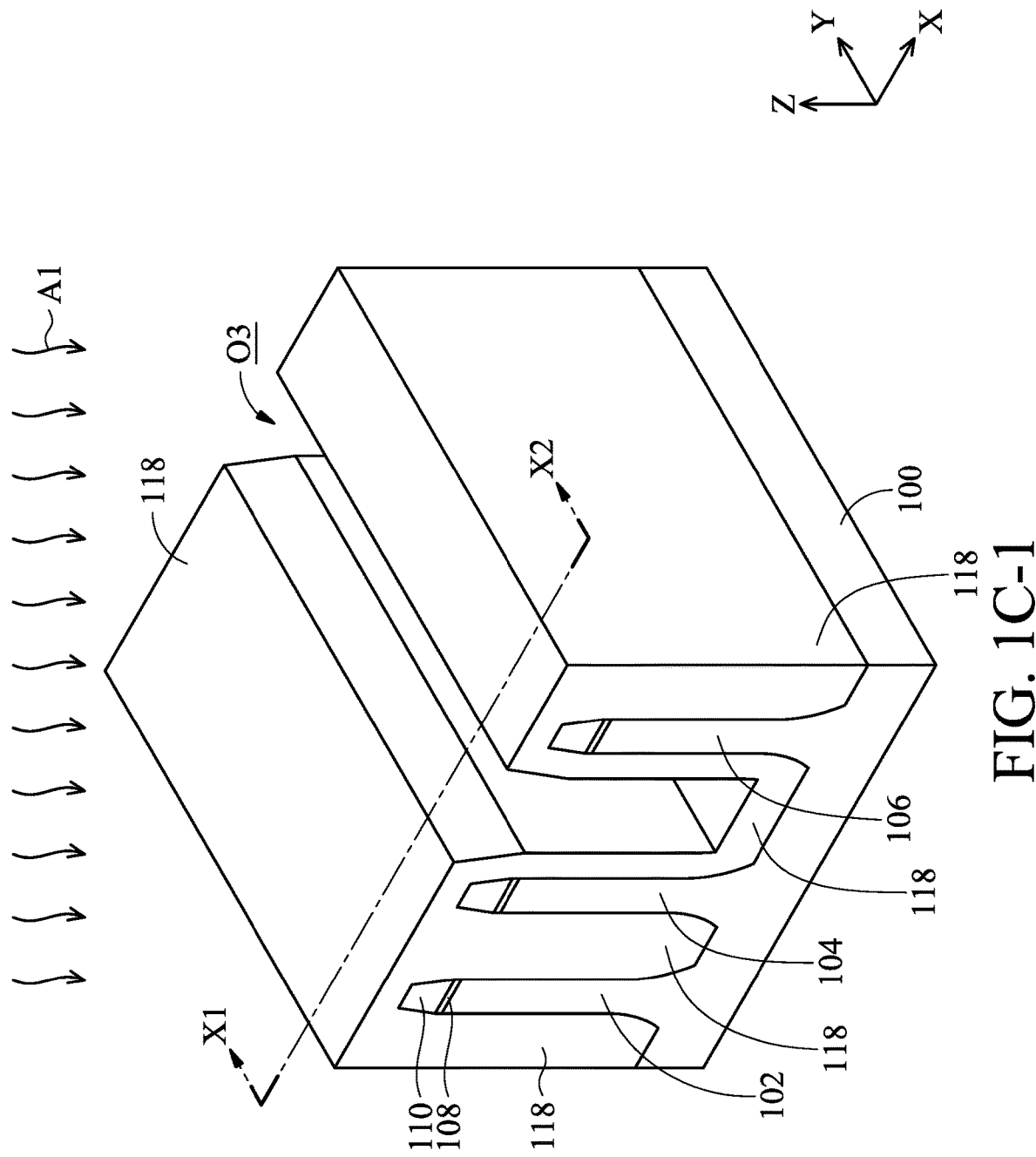
Figures 1, 1C, 2:
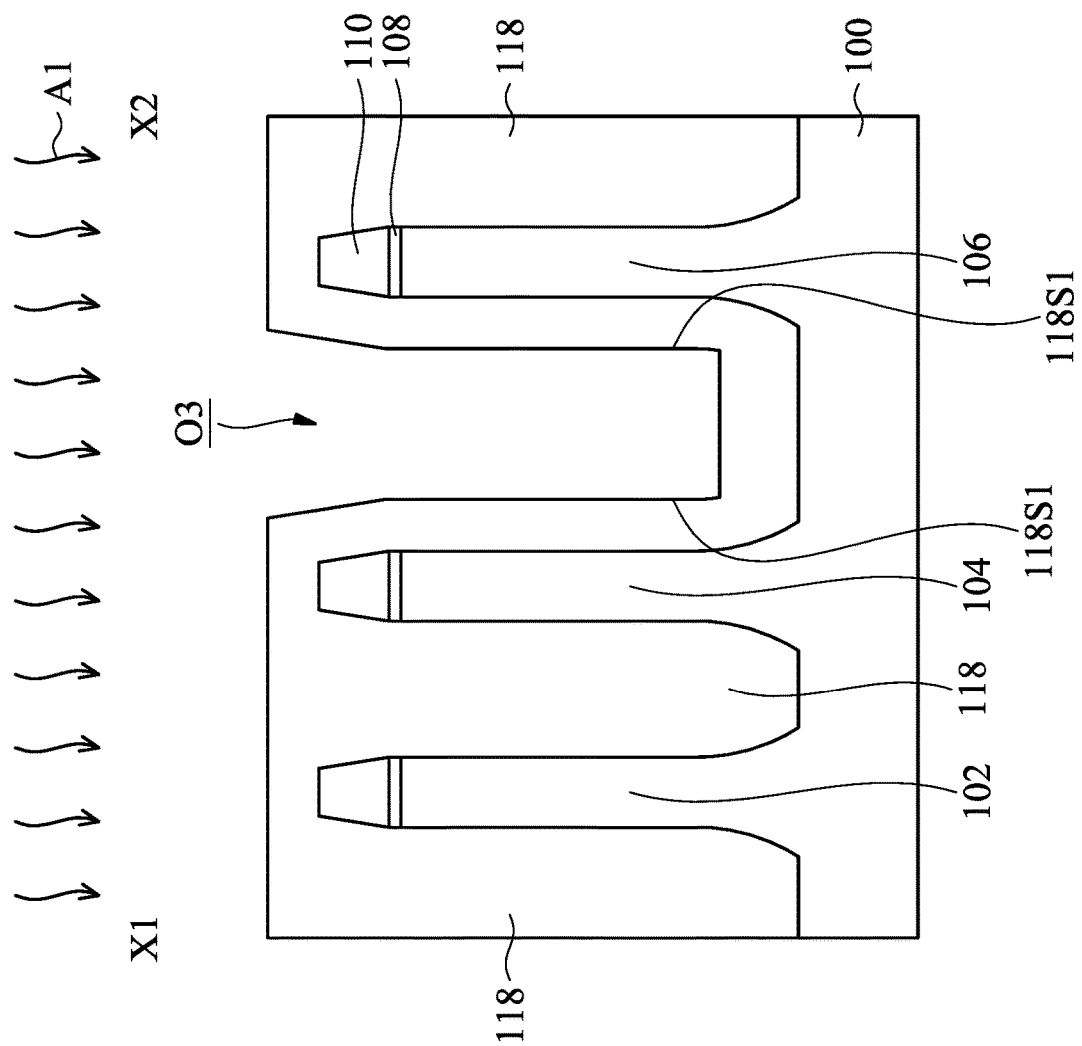

Afterwards, an annealing process A1 may be performed to form an isolation structure 118, as shown in FIGS. 1C-1 and 1C-2 in accordance with some embodiments. In some embodiments, the isolation structure 118 surrounds the semiconductor fins 102, 104 and 106.

In some embodiments, the second dielectric material 116 is cured by the annealing process A1. In some embodiments, the annealing process A1 heats the first dielectric material 112 and the second dielectric material 116 to react the first dielectric material 112 and the second dielectric material 116 to form the isolation structure 118.

The annealing process A1 may be performed with an annealing temperature in a range from about 300° C. to about 500° C. The annealing process A1 may be performed with an annealing time (duration) in a range from about 1800 seconds to about 10800 seconds (e.g., in a range from about 1800 seconds to about 3600 seconds). The annealing temperature and the annealing time of the annealing process A1 may be adjusted to reduce the defects in the isolation structure 118.

In some embodiments, the isolation structure 118 includes oxide (e.g., silicon oxide). In some embodiments, the annealing process A1 may be performed in an oxygen-containing atmosphere. For example, the annealing process A1 may be performed in an oxygen-containing atmosphere including oxygen gas ($O_2$), steam ($H_2O$), another applicable gas or a combination thereof. For example, the semiconductor substrate 100 and the materials formed thereon may be transferred into an annealing chamber, and oxygen gas and/or steam may be flowed into the annealing chamber to create an oxygen-containing atmosphere to perform the annealing process A1.

In some embodiments, during the annealing process A1, some silicon in the first dielectric material 112 and the second dielectric material 116 reacts with the oxygen (e.g., oxygen from the oxygen-containing atmosphere) to form silicon oxide, and thus the isolation structure 118 includes silicon oxide. In some embodiments, the oxygen content of the isolation structure 118 is greater than the oxygen content of the first dielectric material 112 and the oxygen content of the second dielectric material 116.

In some embodiments, some nitrogen and carbon in the first dielectric material 112 and the second dielectric material 116 may be driven out by diffusion during the annealing process A1.

The carbon content in the first dielectric material 112 and the carbon content in the second dielectric material 116 may be reduced by the annealing process A1. The nitrogen content in the first dielectric material 112 and the nitrogen content in the second dielectric material 116 may be reduced by the annealing process A1. In some embodiments, the carbon content of the isolation structure 118 is lower than the carbon content of the first dielectric material 112 and the carbon content of the second dielectric material 116. In some embodiments, the nitrogen content of the isolation structure 118 is lower than the nitrogen content of the first dielectric material 112 and the nitrogen content of the second dielectric material 116.

In some embodiments, since the isolation structure 118 is formed by reacting the first dielectric material 112 and the second dielectric material 116, the isolation structure 118 can have both conformal property and improved gap-fill capability. For example, in some embodiments, the isolation structure 118 fills the trench between the semiconductor fins 102 and 104, and conformally lines the sidewalls of the semiconductor fins 104 and 106 and the top surface of the semiconductor substrate 100 between the semiconductor fins 104 and 106, as shown in FIGS. 1C-1 and 1C-2.

In some embodiments, since the isolation structure 118 is conformally formed on the sidewalls and bottom surface of the trench between the semiconductor fins 104 and 106, there is a trench O3 defined by sidewalls 118S1 of the isolation structure 118 between the semiconductor fins 104 and 106, as shown in FIGS. 1C-1 and 1C-2.

Figures 1, 1D:
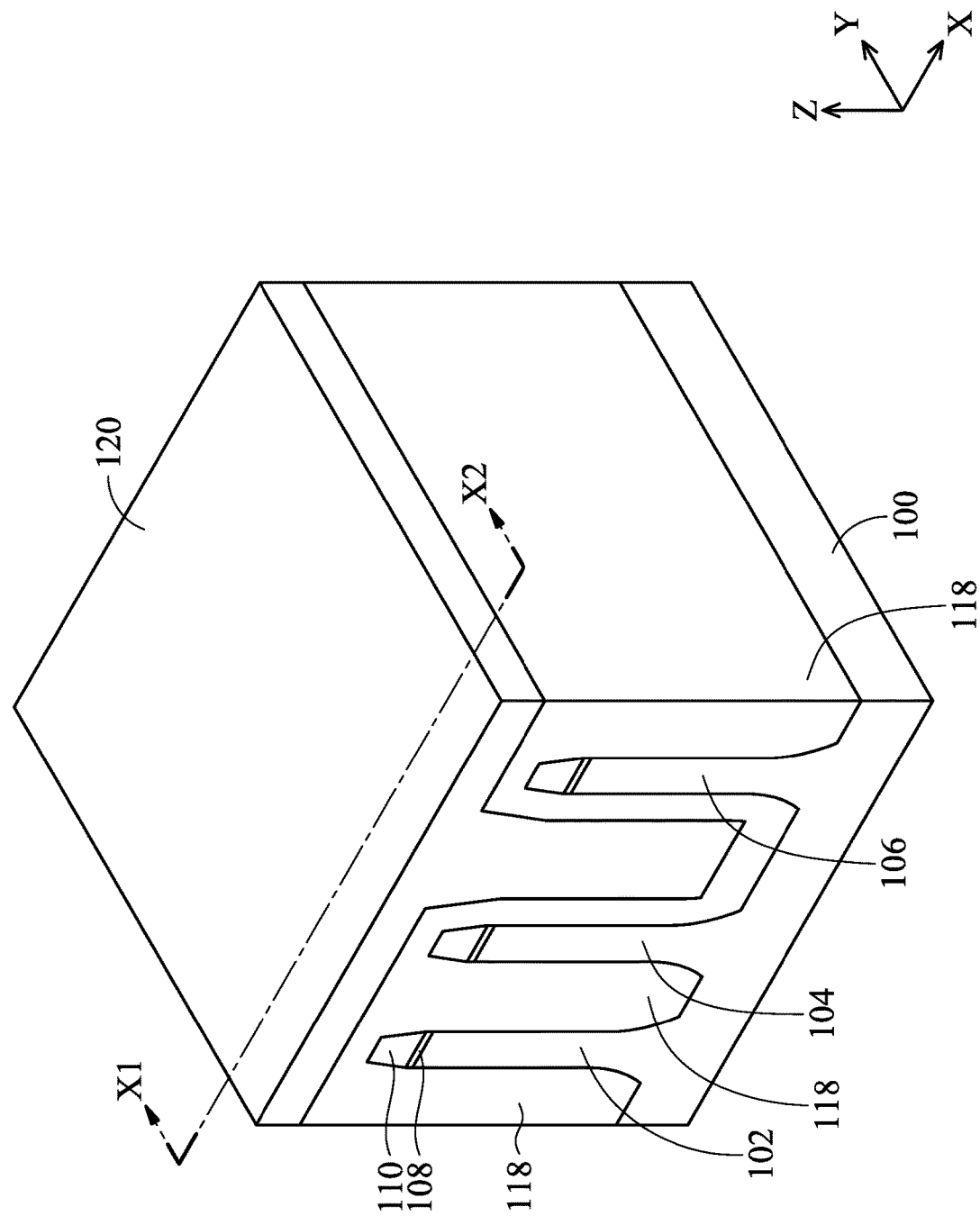
Figures 1, 1D, 2:
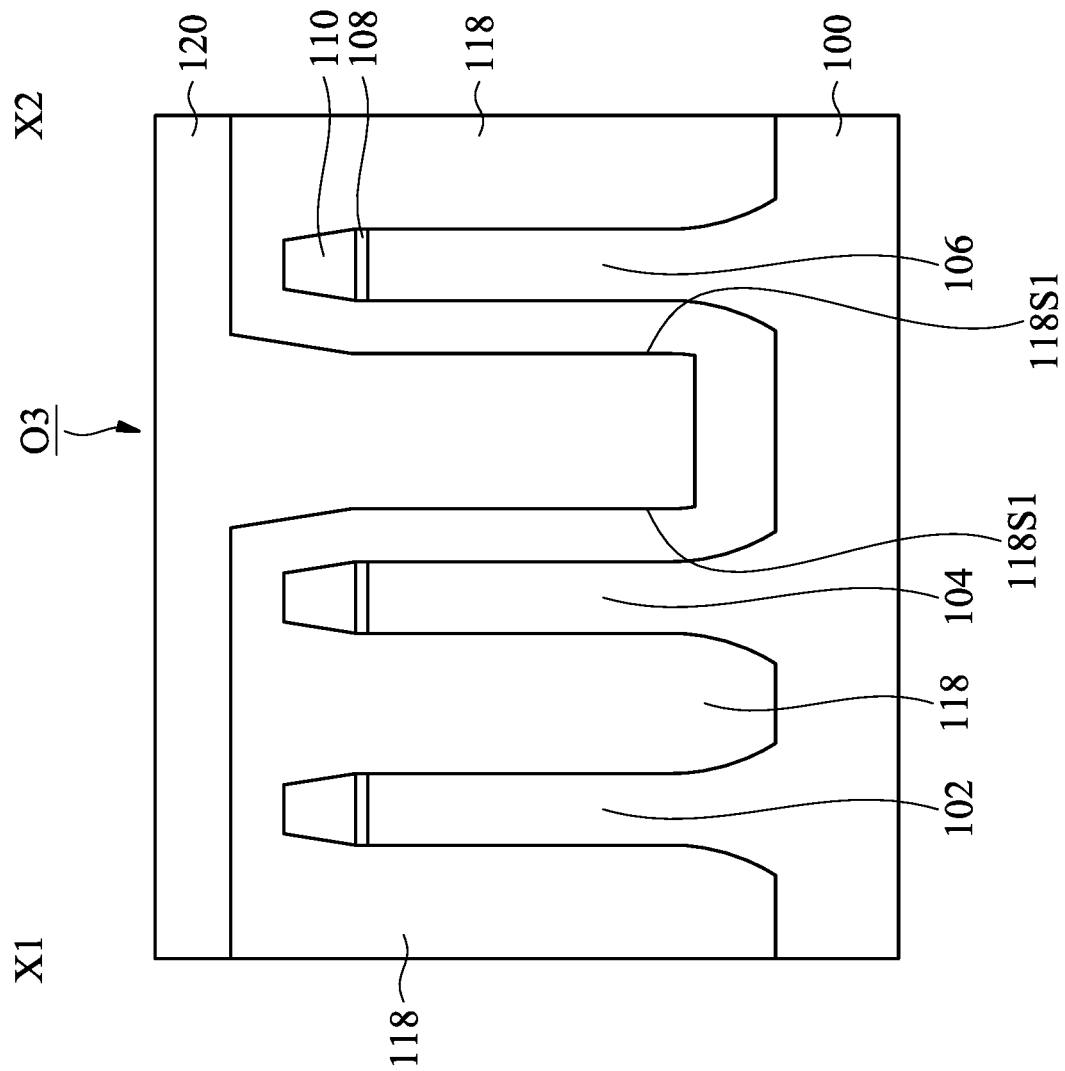

Afterwards, a third dielectric material 120 is formed on the isolation structure 118, as shown in FIGS. 1D-1 and 1D-2 in accordance with some embodiments. In some embodiments, the trench O3 is filled with the third dielectric material 120, as shown in FIGS. 1D-1 and 1D-2.

For example, the third dielectric material 120 may be formed using a chemical vapor deposition process, an atomic layer deposition process, another applicable process, or a combination thereof. For example, the third dielectric material 120 may include silicon, oxygen, carbon, nitrogen, hydrogen, or a combination thereof.

In some embodiments, since the trench between the semiconductor fins 102 and 104 is filled with the isolation structure 118 before the formation of the third dielectric material 120, the isolation structure 118 can serve as a blocking layer during the formation of the third dielectric material 120, so as to prevent the third dielectric material 120 from forming between the semiconductor fins 102 and 104.

Figures 1, 1E:
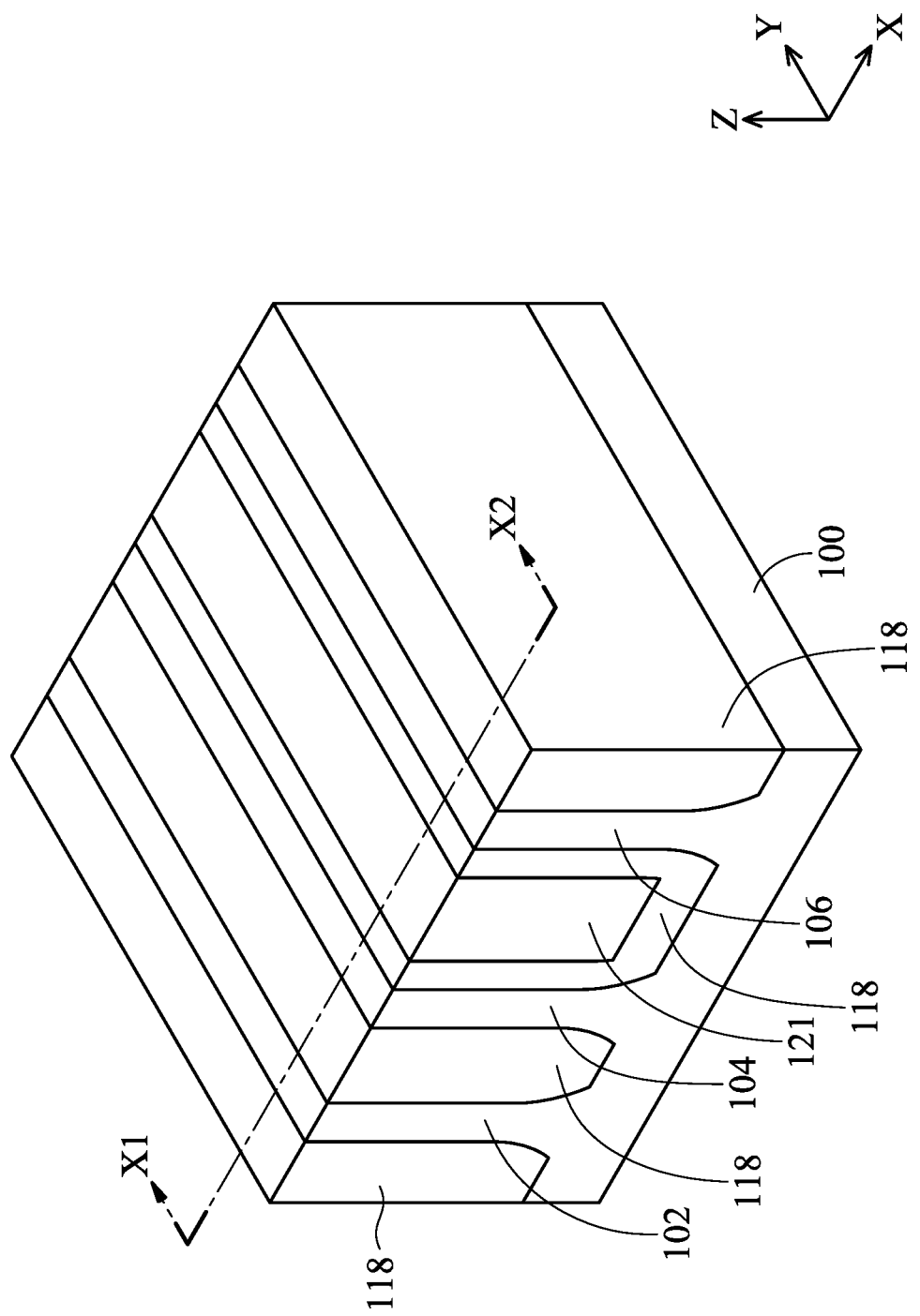
Figures 1, 1E, 2:
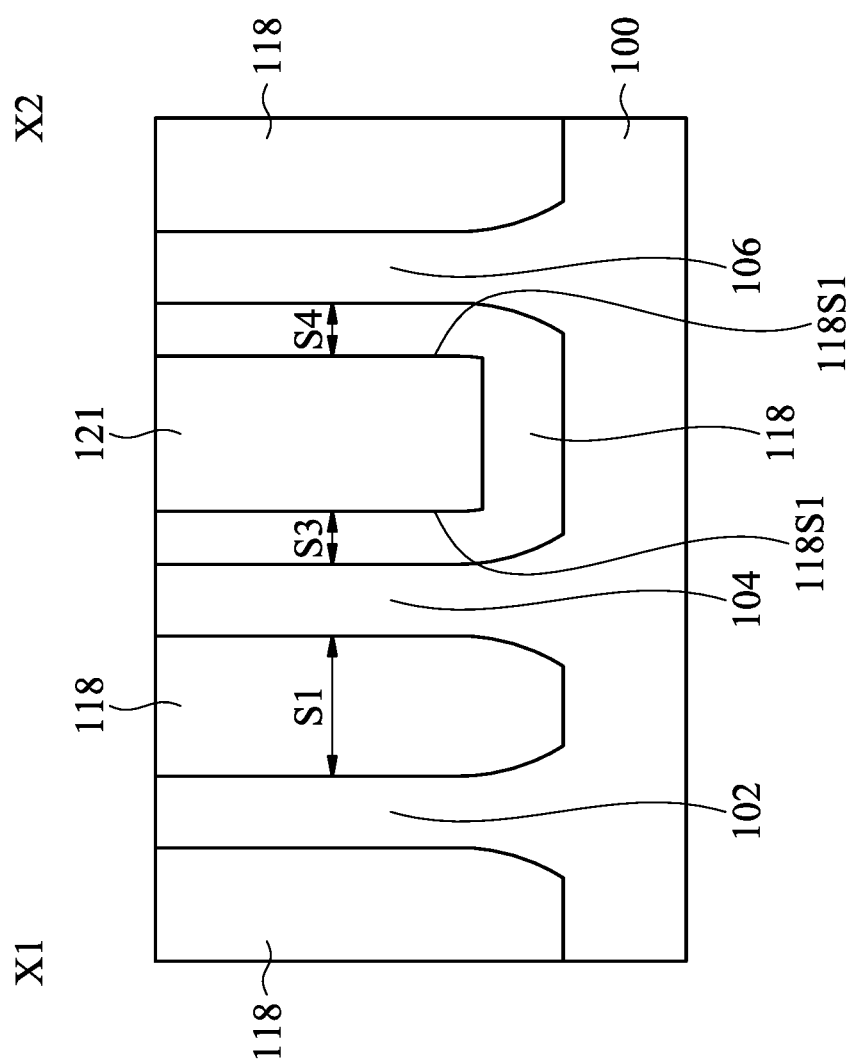

Afterwards, a planarization process is performed to remove the upper portion of the third dielectric material 120, the upper portion of the isolation structure 118, the second mask layer 110 and the first mask layer 108, as shown in FIGS. 1E-1 and 1E-2 in accordance with some embodiments. The planarization process may also remove the upper portion of the semiconductor fins 102, 104 and 106. For example, the planarization process may include a chemical mechanical polishing process, another applicable process, or a combination thereof.

In some embodiments, after the planarization process, a lower portion of the third dielectric material 120 remains in the trench O3 between the semiconductor fins 104 and 106 to serve as a dielectric fin 121, as shown in FIGS. 1E-1 and 1E-2. In some embodiments, after the planarization process, the top surface of the dielectric fin 121 is substantially level with the top surfaces of the semiconductor fins 102, 104 and 106. In some embodiments, after the planarization process, the top surface of the dielectric fin 121 and the top surfaces of the semiconductor fins 102, 104 and 106 are coplanar.

The dielectric fin 121 and the semiconductor fin 104 may be spaced a distance S3 apart, and the dielectric fin 121 and the semiconductor fin 106 may be spaced a distance S4 apart, as shown in FIG. 1E-2. In some embodiments, distance S3 and distance S4 are the same as or smaller than distance S1. Distance S1 and distance S3 may be adjusted to improve the stress distribution around the semiconductor fin 104.

Figures 1, 1F:
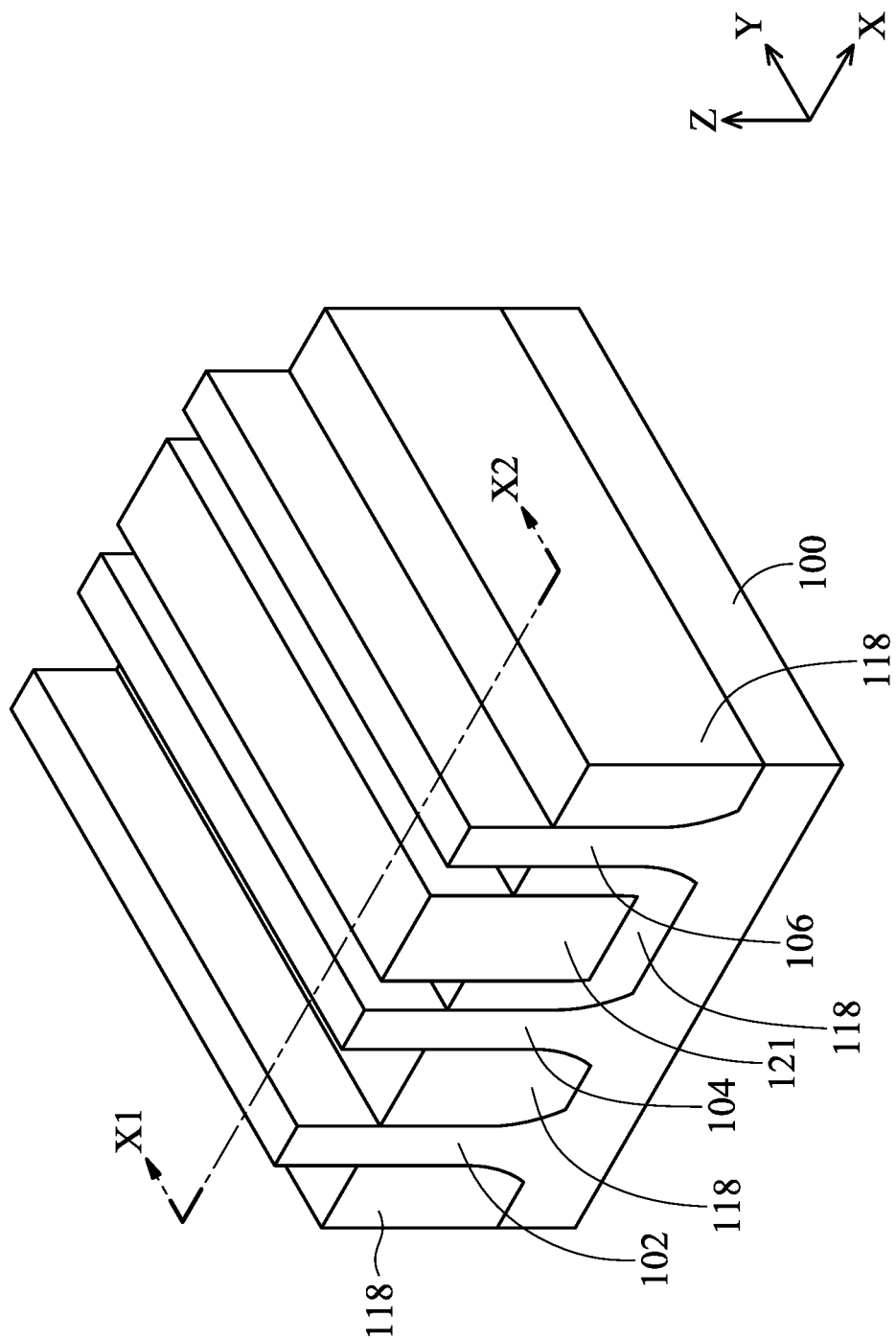
Figures 1, 1F, 2:
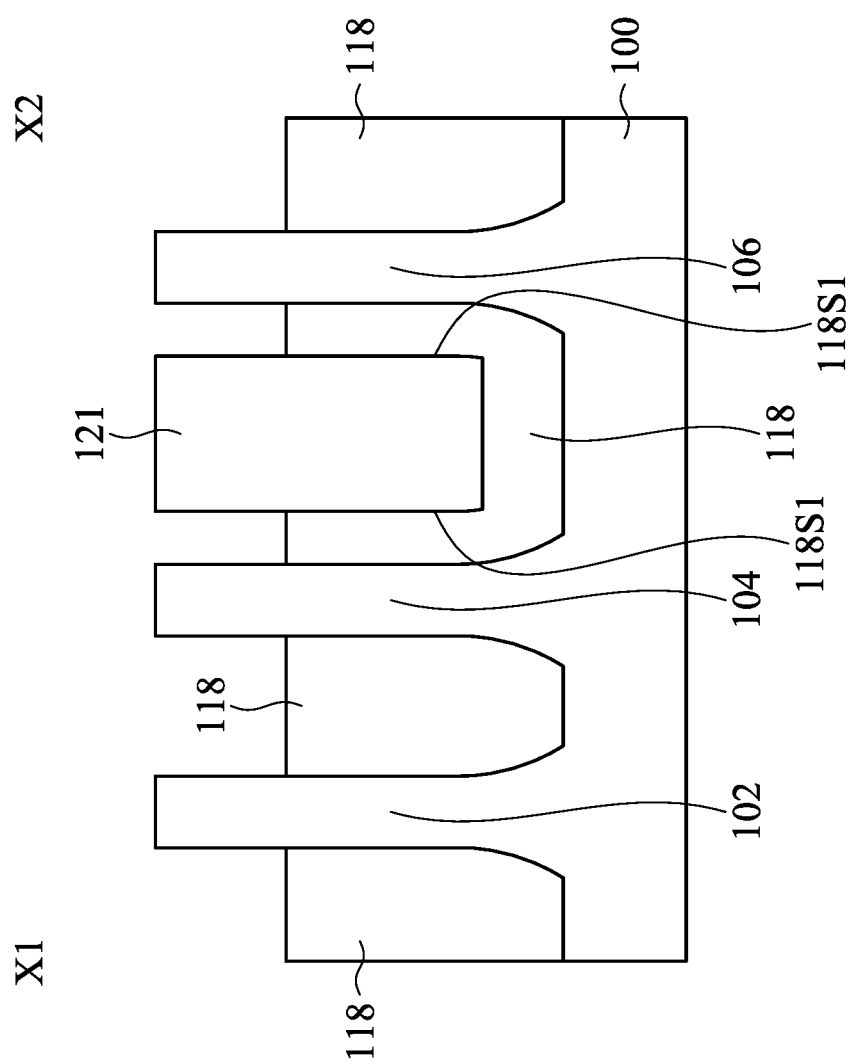

Afterwards, an etching process is performed to etch back the isolation structure 118, as shown in FIGS. 1F-1 and 1F-2 in accordance with some embodiments. In some embodiments, the etching process recesses the isolation structure 118 along the direction Z. In some embodiments, after the etching process, the isolation structure 118 can be referred to as a shallow trench isolation structure surrounding the lower portions of the dielectric fin 121 and the semiconductor fins 102, 104 and 106.

In some embodiments, the composition of the isolation structure 118 may be adjusted to obtain different etch selectivity between the isolation structure 118 and the semiconductor fin (e.g., the semiconductor fins 102, 104 and 106) in the etching process performed to etch back the isolation structure 118, so that the semiconductor fin is not etched (or is only slightly etched) by the etching process performed to etch back the isolation structure 118.

In some embodiments, the composition of the dielectric fin 121 may be adjusted so that the etch selectivity of the dielectric fin 121 is the same as or similar to the etch selectivity of the semiconductor fin (e.g., the semiconductor fins 102, 104 and 106) in the etching process performed to etch back the isolation structure 118. In some embodiments, the dielectric fin 121 and the semiconductor fins 102, 104 and 106 are not etched (or are only slightly etched) by the etching process performed to etch back the isolation structure 118.

Figure 1G:
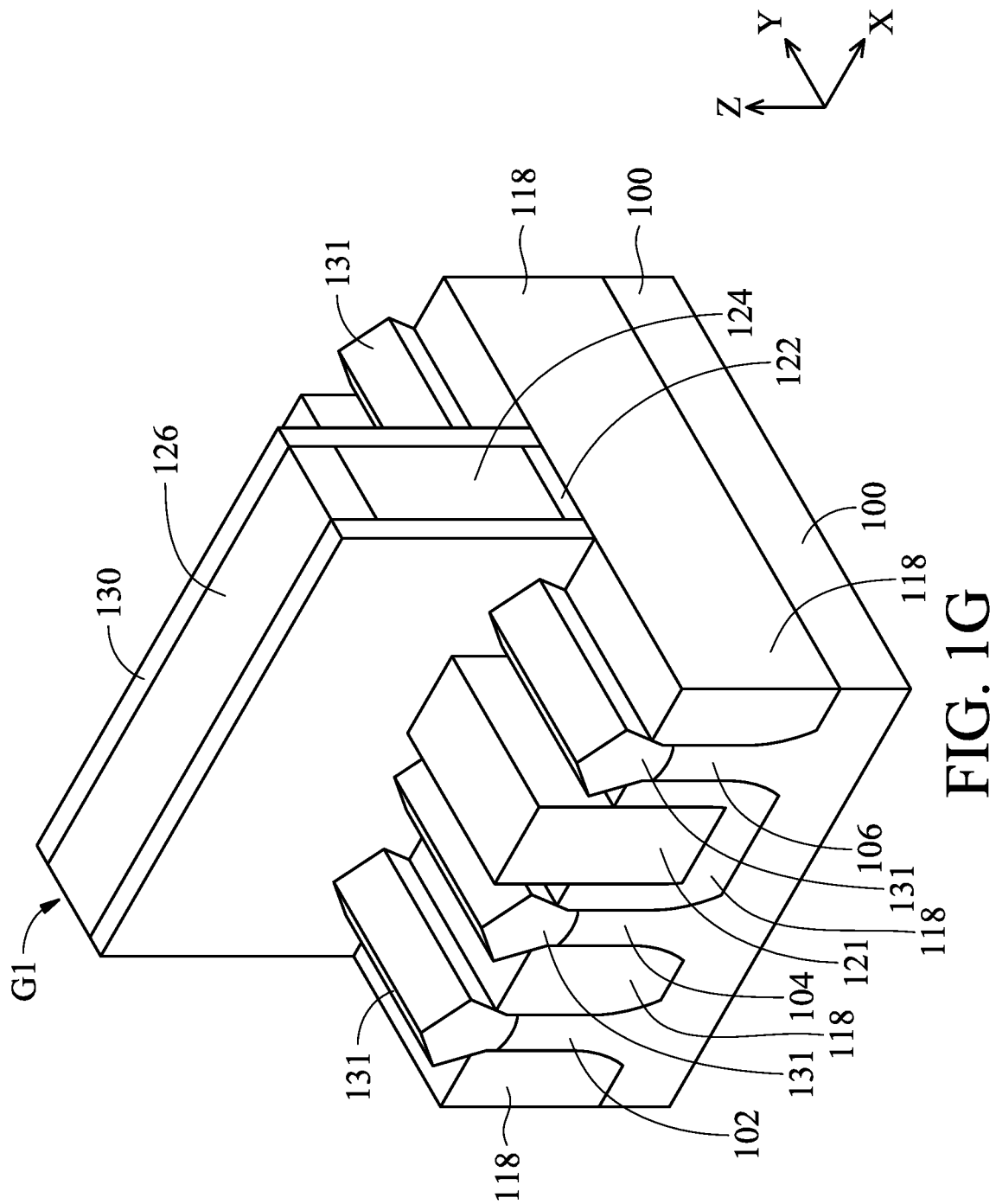

Afterwards, a dummy gate stack G1 is formed across the semiconductor fins 102, 104, and 106, and the dielectric fin 121, as shown in FIG. 1G in accordance with some embodiments. The dummy gate stack G1 may extend over the isolation structure 118, as shown in FIG. 1G. The dummy gate stack G1 may extend along the direction X, the direction X may be the lengthwise direction of the dummy gate stack G1, and the direction Y may be the widthwise direction of the dummy gate stack G1.

In some embodiments, the dummy gate stack G1 includes a dummy gate dielectric layer 122, a dummy gate electrode layer 124 on the dummy gate dielectric layer 122, and a capping layer 126 on the dummy gate electrode layer 124.

The dummy gate dielectric layer 122 may be made of silicon oxide, other applicable dielectric materials, or a combination thereof. The dummy gate electrode layer 124 may be made of poly-silicon, another applicable material, or a combination thereof. The capping layer 126 may be made of silicon nitride, another applicable material, or a combination thereof.

The dummy gate dielectric layer 122, the dummy gate electrode layer 124, and the capping layer 126 may be formed by applicable deposition processes (e.g., chemical vapor deposition process) and patterning processes (e.g., a photolithography process, and an etching process).

After the dummy gate stack G1 is formed, gate sidewall spacers 130 are formed on the sidewalls of the dummy gate stack G1, as shown in FIG. 1G in accordance with some embodiments. In some embodiments, the gate sidewall spacers 130 are made of silicon nitride, silicon oxide, other applicable materials, or a combination thereof. In some embodiments, the gate sidewall spacers 130 are formed by a deposition process (e.g., an atomic layer deposition process) followed by an anisotropic etching process (e.g., a reactive ion etching process, a neutral beam etching process, a plasma etching process, or a combination thereof).

Afterwards, source/drain (S/D) structures 131 are formed over and/or in the semiconductor fins 102, 104 and 106, as shown in FIG. 1G in accordance with some embodiments. In some embodiments, the S/D structures 131 are formed on the semiconductor fins (e.g., the semiconductor fins 102, 104 and 106) on opposite sides of the dummy gate stack G1, as shown in FIG. 1G.

In some embodiments, portions of the semiconductor fins 102, 104 and 106 adjacent to the dummy gate stack G1 are recessed to form recesses, and strained materials are grown in the recesses by an epitaxial (epi) process to form the S/D structures 131. In addition, the lattice constant of the strained materials may be different from the lattice constant of the semiconductor substrate 100. In some embodiments, the S/D structures 131 include Si, Ge, SiGe, InAs, InGaAs, InSb, GaAs, GaSb, InAlP, InP, other applicable materials, or a combination thereof.

Figure 1H:
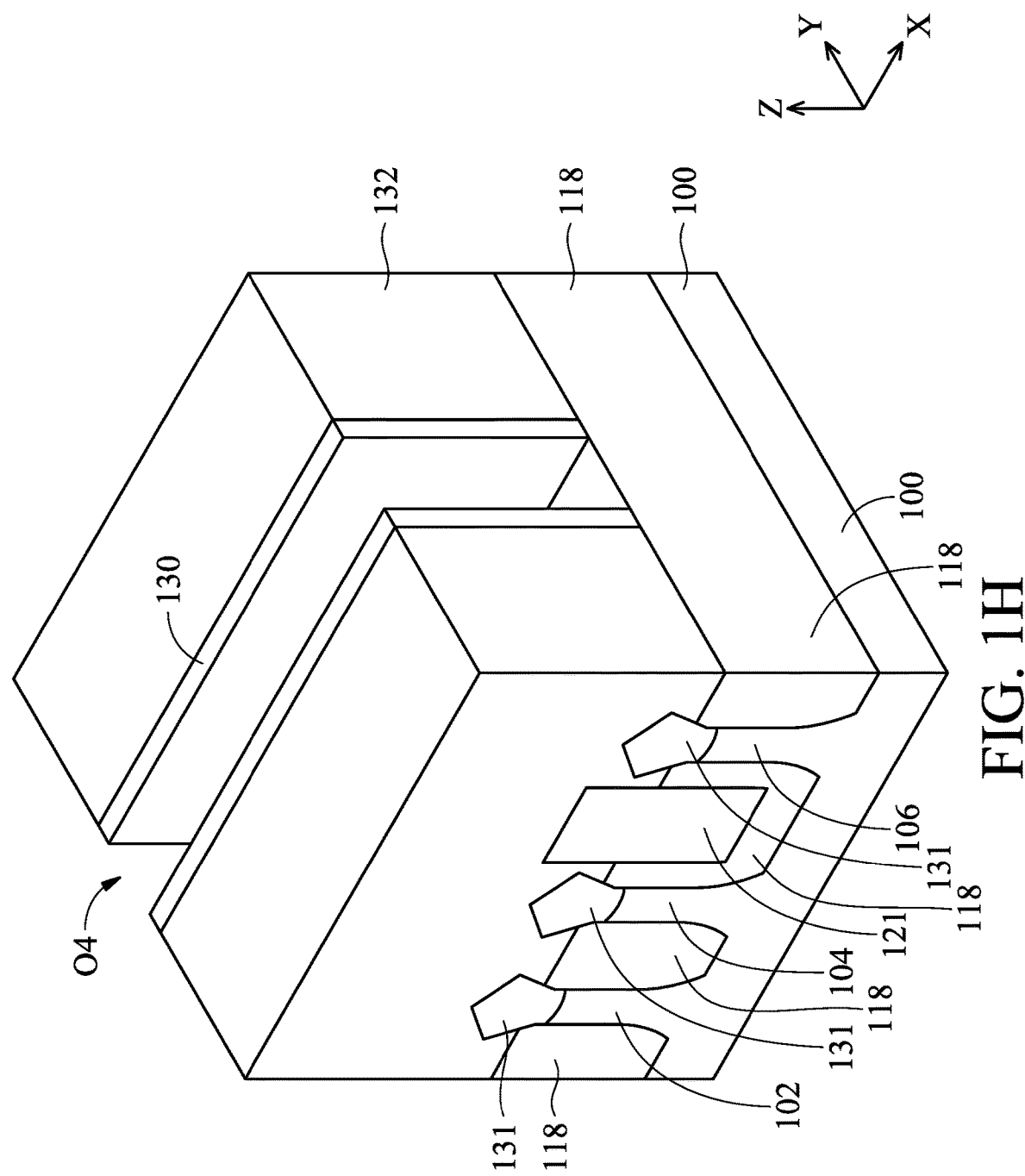

After the source/drain structures 131 are formed, an interlayer dielectric (ILD) layer 132 is formed over semiconductor substrate 100, as shown in FIG. 1H in accordance with some embodiments. The ILD layer 132 may cover the semiconductor fins 102, 104 and 106, and the dielectric fin 121, as shown in FIG. 1H.

For example, the ILD layer 132 may include silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the ILD layer 132 may be formed using a chemical vapor deposition process, a spin-on coating process, another applicable process, or a combination thereof.

Afterwards, the dummy gate stack G1 is removed to form a trench (or recess) O4 in the ILD layer 132, as shown in FIG. 1H in accordance with some embodiments. The trench O4 may be formed using a dry etching process, a wet etching process, or a combination thereof.

Figure 1I:
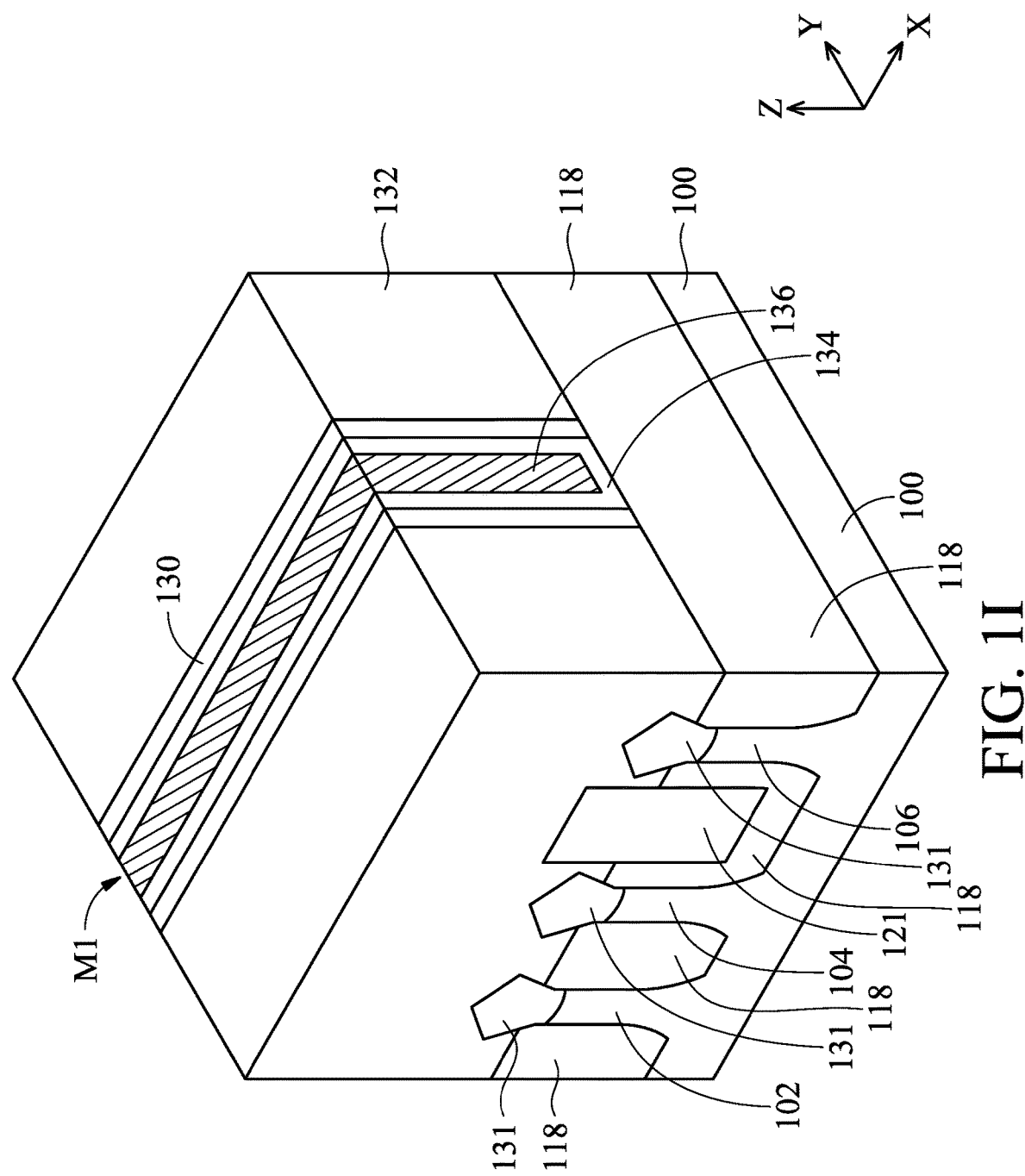

Afterwards, a gate dielectric layer 134 is formed in the trench O4, as shown in FIG. 1I. In some embodiments, the gate dielectric layer 134 includes silicon oxide. In some embodiments, the gate dielectric layer 134 includes high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The gate dielectric layer 134 may be formed using a chemical vapor deposition process, an atomic layer deposition process, another applicable process, or a combination thereof.

Afterwards, a metal gate electrode layer 136 is formed on the gate dielectric layer 134 in the trench O4, as shown in FIG. 1I in accordance with some embodiments. The metal gate electrode layer 136 combined with the gate dielectric layer 134 may be referred to as a gate stack M1.

The metal gate electrode layer 136 may be made of tungsten, titanium, aluminum, copper, molybdenum, nickel, platinum, ruthenium, another applicable metal, or a combination thereof. For example, the metal gate electrode layer 136 may be formed by a physical vapor deposition process, another applicable deposition process, or a combination thereof.

Figure 1J:
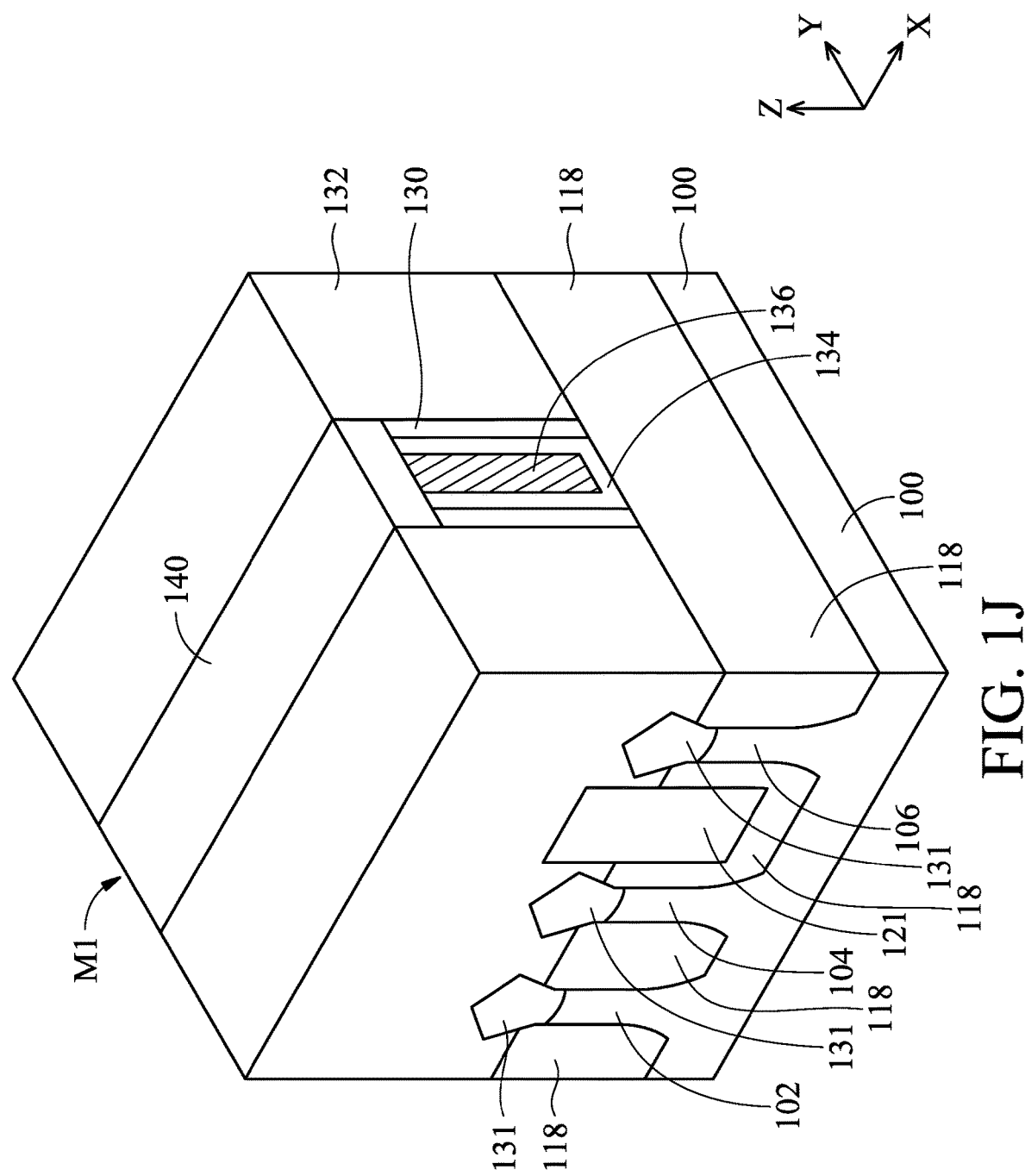

Afterwards, the gate stack M1 is recessed, and then a mask layer 140 is formed on the gate stack M1, as shown in FIG. 1J in accordance with some embodiments. For example, an etching process (e.g., a dry etching process, a wet etching process, or a combination thereof) may be used to recess the gate stack M1. In some embodiments, the etching process performed to recess the gate stack M1 also removes upper portions of the gate sidewall spacers 130, as shown in FIG. 1J.

For example, the mask layer 140 may include silicon oxide, silicon nitride, silicon oxynitride, another applicable material, or a combination thereof. For example, the mask layer 140 may be formed by a deposition process (e.g., a chemical vapor deposition process, an atomic layer deposition process, another applicable process, or a combination thereof).

Figure 1K:
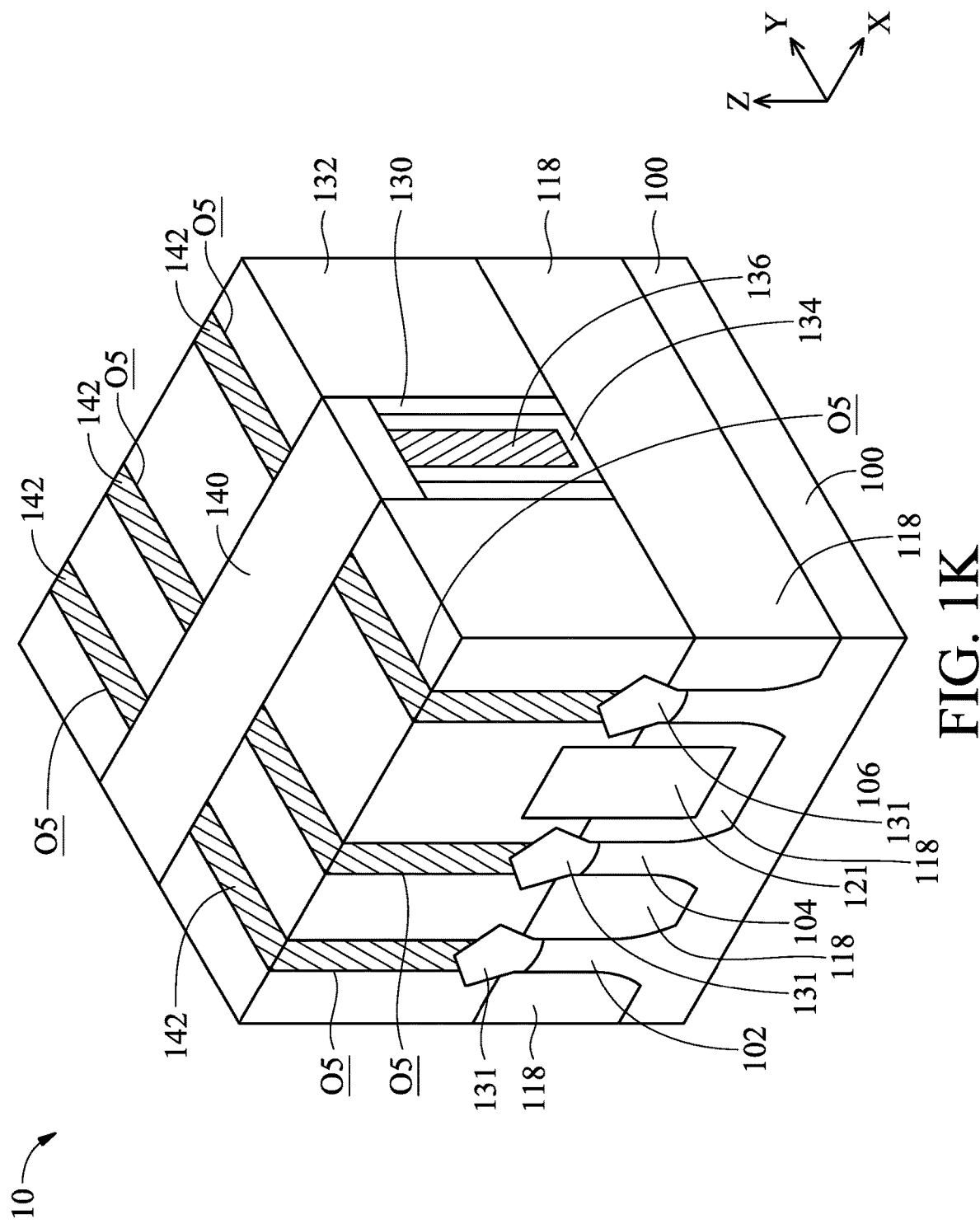
Figure 2:
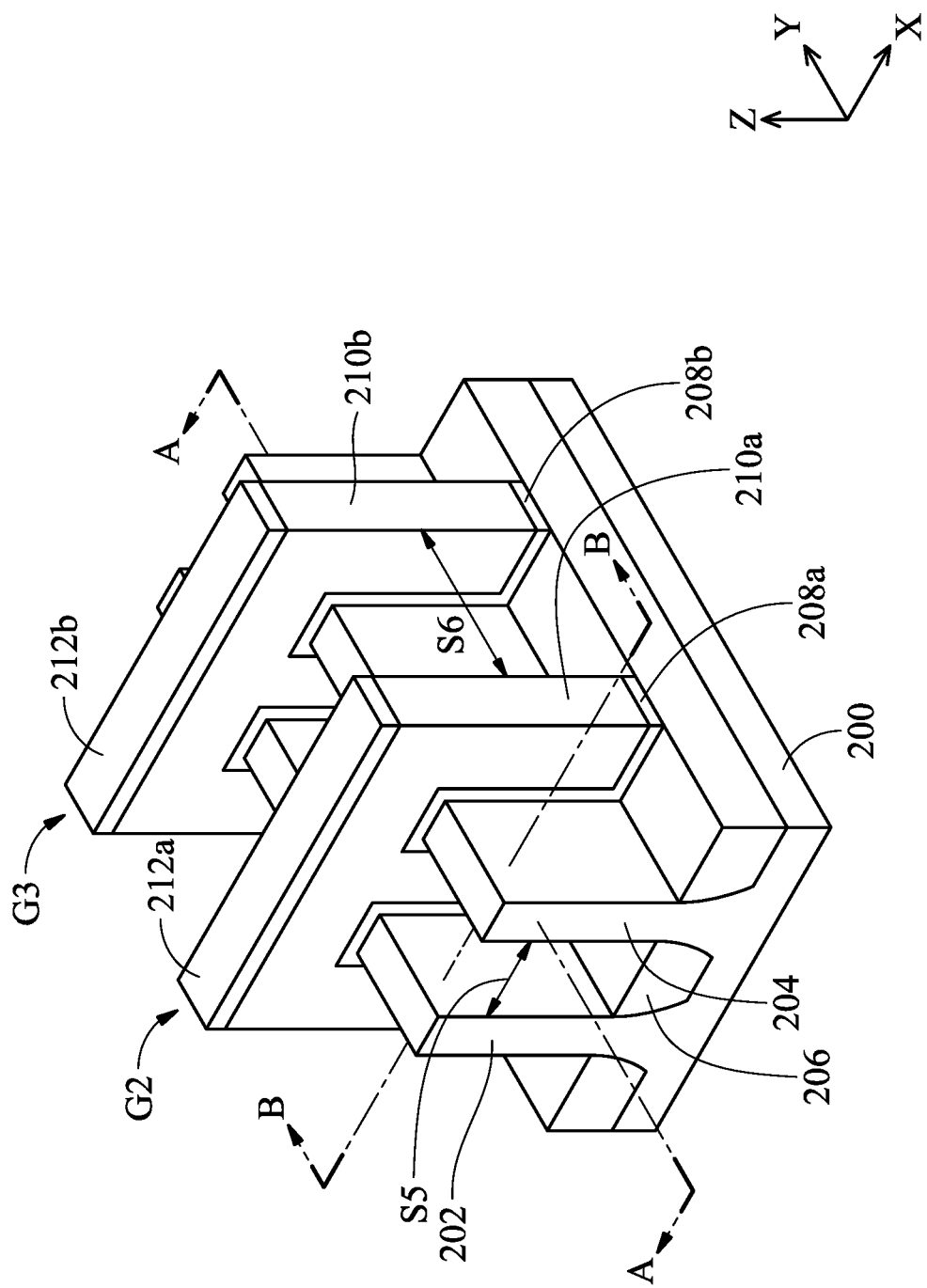

Afterwards, trenches O5 are formed in the ILD layer 132, and source/drain (S/D) contact structures 142 are formed in the trenches O5, so as to form a semiconductor structure 10, as shown in FIG. 1K in accordance with some embodiments. The trenches O5 may be formed by a photolithography process followed by an etching process.

The trenches O5 may be filled with applicable conductive materials to form the S/D contact structures 142 using a physical vapor deposition process, an atomic layer deposition process, a plating process, another applicable process, or a combination thereof. For example, the S/D contact structures 142 may be made of tungsten, cobalt, titanium, aluminum, copper, tantalum, platinum, molybdenum, silver, manganese, zirconium, ruthenium, another applicable conductive material, or a combination thereof.

The S/D contact structures 142 may be electrically connected to the S/D structures 131. In some embodiments, the S/D contact structures 142 are in direct contact with the S/D structures 131, as shown in FIG. 1K.

FIG. 2 is a perspective view illustrating a stage of a method for forming a semiconductor structure, in accordance with some embodiments of the present disclosure. FIGS. 3A-1, 3B-1, 3C-1, 3D-1, 3E-1, 3F-1 and 3G-1 are a series of cross-sectional views which are taken along line A-A of FIG. 2 and illustrate various stages following the stage illustrated in FIG. 2 of a method for forming a semiconductor structure, in accordance with some embodiments. FIGS. 3A-2, 3B-2, 3C-2, 3D-2, 3E-2, 3F-2 and 3G-2 are a series of cross-sectional views which are taken along line B-B of FIG. 2 and illustrate various stages following the stage illustrated in FIG. 2 of a method for forming a semiconductor structure, in accordance with some embodiments.

A semiconductor substrate 200 is provided, as shown in FIG. 2 in accordance with some embodiments. The semiconductor substrate 200 may be the same as or similar to the semiconductor substrate 100 of the above embodiments. In the interest of simplicity, the details will not be discussed again.

Afterwards, semiconductor fins 202 and 204 are formed by patterning the semiconductor substrate 200, as shown in FIG. 2 in accordance with some embodiments. The semiconductor fins 202 and 204 may be spaced a distance S5 apart widthwise (i.e., the direction X) of the semiconductor fins 202 and 204, as shown in FIG. 2.

The semiconductor fins 202 and 204 may be the same as or similar to the semiconductor fins 102, 104 and 106 of the above embodiments. The methods for forming the semiconductor fins 202 and 204 may be the same as or similar to those for forming the semiconductor fins 102, 104 and 106 of the above embodiments. In the interest of simplicity, the details will not be discussed again.

After the semiconductor fins 202 and 204 are formed, an isolation structure 206 is formed over the semiconductor substrate 200, as shown in FIG. 2 in accordance with some embodiments. The isolation structure 206 may surround the semiconductor fins 202 and 204, and a portion of the isolation structure 206 may be located between the semiconductor fins 204 and 204, as shown in FIG. 2.

The isolation structure 206 may be referred to as a shallow trench isolation structure. In some embodiments, the isolation structure 206 is formed by depositing an insulating layer over the semiconductor substrate 200 and recessing the insulating layer. In some embodiments, the isolation structure 206 includes silicon oxide, silicon nitride, silicon oxynitride, fluoride-doped silicate glass (FSG), other applicable dielectric materials, or a combination thereof.

Afterwards, a dummy gate stack G2 and a dummy gate stack G3 are formed across the semiconductor fins 202 and 204, as shown in FIG. 2 in accordance with some embodiments. The dummy gate stacks G2 and G3 may be the same as or similar to the dummy gate stack G1 of the above embodiments. The materials and methods for forming the dummy gate stacks G2 and G3 may be the same as or similar to those for forming the dummy gate G1 of the above embodiments. In the interest of simplicity, the details will not be discussed again.

In some embodiments, similar to dummy gate stack G1, dummy gate stack G2 includes a dummy gate dielectric layer 208*a*, a dummy gate electrode layer 210*a* and a capping layer 212*a*, and the dummy gate stack G3 includes a dummy gate dielectric layer 208*b*, a dummy gate electrode layer 210*b* and a capping layer 212*b*.

The dummy gate stack G2 and the dummy gate stack G3 may be spaced a distance S6 apart widthwise (i.e., in direction Y) of the dummy gate stacks G2 and G3, as shown in FIG. 2. In some embodiments, distance S6 between the dummy gate stacks G2 and G3 is greater than distance S5 between the semiconductor fins 202 and 204.

Afterwards, a dielectric material 214 is formed on the semiconductor substrate 200, as shown in FIGS. 3A-1 and 3A-2 in accordance with some embodiments. In some embodiments, the dielectric material 214 is conformally formed on the semiconductor fins 202 and 204, and the dummy gate stacks G2 and G3, as shown in FIGS. 3A-1 and 3A-2.

The dielectric material 214 may line the sidewalls and the top surfaces of the dummy gate stacks G2 and G3, and may line the top surfaces of the semiconductor fins 202 and 204 between the dummy gate stacks G2 and G3, as shown in FIG. 3A-1. The dielectric material 214 may also line the sidewalls and the top surfaces of the semiconductor fins 202 and 204, and may line the top surface of the semiconductor substrate 200 between the semiconductor fins 202 and 204, as shown in FIG. 3A-2.

In some embodiments, there is a trench (or gap) O6 between the semiconductor fins 202 and 204 as shown in FIG. 3A-2, and there is a trench O7 between the dummy gate stacks G2 and G3, as shown in FIG. 3A-1. The trench O6 may be defined by sidewalls 214S1 of the dielectric material 214 between the semiconductor fins 202 and 204, and the trench O7 may be defined by sidewalls 214S2 of the dielectric material 214 between the dummy gate stacks G2 and G3.

The trench O6 may have a width W3 along the direction X, and the trench O7 may have a width W4 along the direction Y. In some embodiments, the width W3 of the trench O6 is smaller than the width W4 of the trench O7.

The materials and the methods for forming the dielectric material 214 may be the same as or similar to those for forming the first dielectric material 112 of the above embodiments. In the interest of simplicity, the details will not be discussed again.

Afterwards, a dielectric material 218 is formed on the dielectric material 214, as shown in FIGS. 3B-1 and 3B-2 in accordance with some embodiments. In some embodiments, the trench O6 between the semiconductor fin 202 and the semiconductor fin 204 is filled with a portion of the dielectric material 218, as shown in FIGS. 3B-1 and 3B-2.

In some embodiments, a portion of the dielectric material 218 is formed on the dielectric material 214 between the dummy gate stacks G2 and G3, as shown in FIG. 3B-1. In some embodiments, since the width W4 of the trench O7 is greater than the width W3 of the trench O6, the thickness H3 of the portion of the dielectric material 218 that is between the sidewalls 214S1 of the dielectric material 214 is greater the thickness H4 of the portion of the dielectric material 218 that is between the sidewalls 214S2 of the dielectric material 214. In some embodiments, the top region of the trench O7 remains unfilled after the formation of the dielectric material 218.

In some embodiments, the dielectric material 218 is a flowable dielectric material, so that it has an improved gap-fill capability to fill the trench O6 having a small size (e.g., the width W3 of the trench O6 may be in a range from about 0.1 nm to about 5 nm). In some embodiments, the flowable dielectric material may be polysilazane, triethylamine, another applicable material, or a combination thereof.

In some embodiments, the dielectric material 218 is or includes a flowable dielectric material formed by a flowable chemical vapor deposition (FCVD) process. In some embodiments, in the flowable chemical vapor deposition process for forming the dielectric material 218, various chemistries are added to silicon-containing precursors to allow the deposited dielectric material 218 to flow.

In some embodiments, in the flowable chemical vapor deposition process for forming the dielectric material 218, the precursor of the dielectric material 218 includes a silicate, a siloxane, a methyl silsesquioxane (MSQ), a hydrogen silsesquioxane (HSQ), a perhydrosilazane (TCPS), a perhydro-polysilazane (PSZ), a tetraethyl orthosilicate (TEOS), a silyl-amine (e.g., trisilylamine (TSA)), or a combination thereof.

In some embodiments, in the flowable chemical vapor deposition process for forming the dielectric material 218, a plasma is induced to react the precursor of the dielectric material 218 to form oligomers by a gas phase reaction, and then the oligomers deposit on the dielectric material 214 to form the dielectric material 218.

The oligomers may have a low molecular weight. For example, the number-average molecular weight of the oligomers of the dielectric material 218 may be in a range from about 50 to about 150. The number-average molecular weight of the oligomers may be adjusted, so that it is easier for the oligomers to enter the trench O6 between the semiconductor fins 202 and 204, improving the gap-fill capability of the dielectric material 218 with respect to the trench O6.

The viscosity of the dielectric material 218 may be in a range from about 0.1 centipoise to about 2 centipoise. The viscosity of the dielectric material 218 may be adjusted so that the gap-fill capability of the dielectric material 218 to fill the trench O6 defined by the sidewalls 214S1 of the dielectric material 214 formed in an atomic layer deposition process may be improved.

In some embodiments, the dielectric material 218 includes silicon, oxygen, nitrogen, hydrogen, carbon, or a combination thereof. In some embodiments, the carbon content of the dielectric material 218 is lower than the carbon content of the dielectric material 214. For example, the carbon content of the dielectric material 214 may be in a range from about 0.1 w.t. % to about 1 w.t. %. For example, the carbon content of the dielectric material 218 may be in a range from about 0.1 w.t. % to about 1 w.t. %. In some embodiments, the dielectric material 218 is substantially free of carbon. By adjusting the carbon content of the dielectric material 218, the viscosity of the dielectric material 218 may be adjusted to improve the gap-fill capability of the dielectric material 218 with respect to the trench O6 having a small size (e.g., the width W3 may be in a range from about 0.1 nm to about 5 nm).

The dielectric constant of the dielectric material 218 may be in a range from about 2 to about 5. The dielectric constant of the dielectric material 218 may be adjusted to improve the electrical performance of a semiconductor structure (e.g., the semiconductor structure 30 illustrated in FIGS. 3G-1 and 3G-2) including the semiconductor fins 202 and 204.

In some embodiments, the trench O6 with a small size (e.g., the width W3 of the trench O6 being in a range from about 0.1 nm to about 5 nm) is filled by a bottom-up deposition of the dielectric material 218 without clogging at the top of the trench O6, reducing defects (e.g. voids or seams) of an isolation structure (e.g., the isolation structure 220 which will be discussed in the following paragraphs) formed from the dielectric material 214 and the dielectric material 218 between the semiconductor fins 202 and 204.

Afterwards, an annealing process A2 is performed to form an isolation structure 220, as shown in FIGS. 3C-1 and 3C-2 in accordance with some embodiments. In some embodiments, the isolation structure 220 surrounds the semiconductor fins 202 and 204, and the dummy gate stacks G2 and G3. In some embodiments, the isolation structure 206 is under the isolation structure 220 and is between the semiconductor substrate 200 and the isolation structure 220, as shown in FIG. 3C-2.

In some embodiments, the dielectric material 218 is cured by the annealing process A2. In some embodiments, the annealing process A2 heats the dielectric material 214 and the dielectric material 218 to react the dielectric material 214 and the dielectric material 218 to form the isolation structure 220.

The annealing process A2 may be performed with an annealing temperature in a range from about 500° C. to about 700° C. The annealing process A2 may be performed with an annealing time (duration) in a range from about 1800 seconds to about 10800 seconds (e.g., in a range from about 1800 seconds to about 7200 seconds). The annealing temperature and the annealing time of the annealing process A2 may be adjusted to reduce the defects in the isolation structure 220.

In some embodiments, the isolation structure 220 includes oxide (e.g., silicon oxide). In some embodiments, the annealing process A2 is performed in an oxygen-containing atmosphere. For example, the annealing process A2 may be performed in an oxygen-containing atmosphere including oxygen gas ($O_2$), steam ($H_2O$), another applicable gas or a combination thereof. For example, the semiconductor substrate 200 and the materials formed thereon may be transferred into an annealing chamber, and oxygen gas and/or steam may be flowed into the annealing chamber to create an oxygen-containing atmosphere to perform the annealing process A2.

In some embodiments, during the annealing process A2, some silicon in the dielectric material 214 and the dielectric material 218 reacts with the oxygen (e.g., oxygen from the oxygen-containing atmosphere) to form silicon oxide, and thus the isolation structure 220 includes silicon oxide. In some embodiments, the oxygen content of the isolation structure 220 is greater than the oxygen content of the dielectric material 214 and the oxygen content of the dielectric material 218.

In some embodiments, some nitrogen and carbon in the dielectric material 214 and the dielectric material 218 may be driven out by diffusion during the annealing process A2.

The carbon content in the dielectric material 214 and the carbon content in the dielectric material 218 may be reduced by the annealing process A2. The nitrogen content in the dielectric material 214 and the nitrogen content in the dielectric material 218 may be reduced by the annealing process A2. In some embodiments, the carbon content of the isolation structure 220 is lower than the carbon content of the dielectric material 214 and the carbon content of the dielectric material 218. In some embodiments, the nitrogen content of the isolation structure 220 is lower than the nitrogen content of the dielectric material 214 and the nitrogen content of the dielectric material 218.

In some embodiments, since the isolation structure 220 is formed by reacting the dielectric material 214 and the dielectric material 218, the isolation structure 220 can have both conformal property and improved gap-fill capability. For example, in some embodiments, the isolation structure 220 fills the trench between the semiconductor fins 202 and 204, and conformally lines the sidewalls of the dummy gate stacks G2 and G3 and the top surfaces of the semiconductor fins 202 and 204 between the dummy gate stacks G2 and G3, as shown in FIGS. 3C-1 and 3C-2.

Figures 2, 3D:
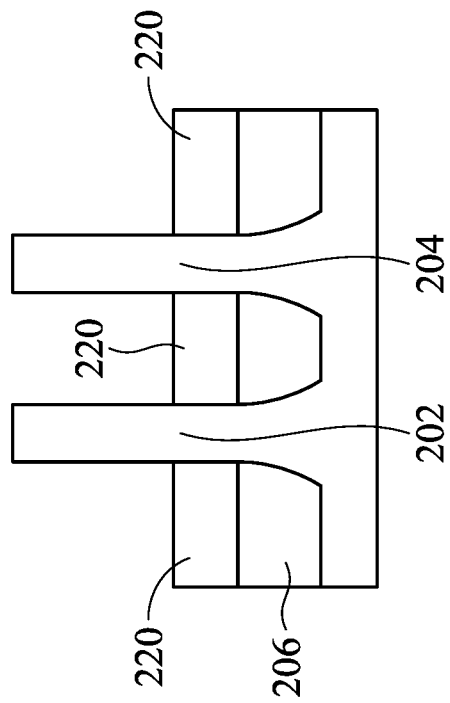
Figures 1, 3D:
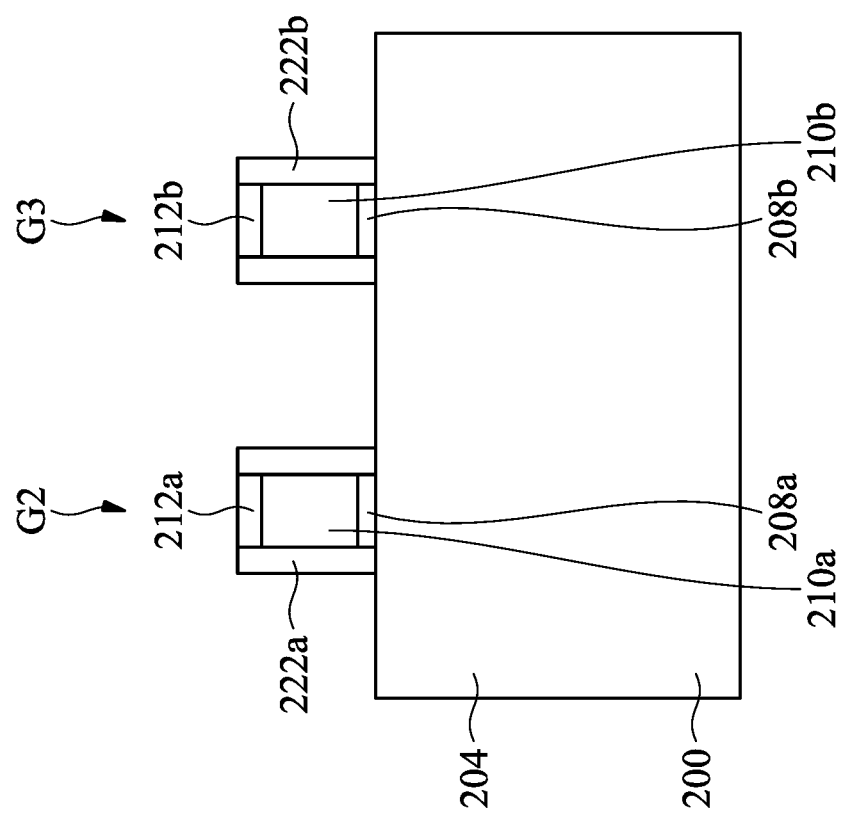

Afterwards, an etching process is performed to etch back the isolation structure 220, as shown in FIGS. 3D-1 and 3D-2 in accordance with some embodiments. The etching process may be an anisotropic etching process (e.g., a reactive ion etching process, a neutral beam etching process, a plasma etching process, or a combination thereof) which anisotropically etches the isolation structure 220, as shown in FIGS. 3D-1 and 3D-2.

In some embodiments, during the etching process performed to etch back the isolation structure 220, the isolation structure 206 between the semiconductor fins 202 and 204 is covered and protected by the isolation structure 220. Therefore, the isolation structure 206 may remain undamaged during the etching process used to etch back the isolation structure 220.

In some embodiments, after the etching process is performed to etch back the isolation structure 220, portions of the isolation structure 220 remain on the sidewalls of the dummy gate stacks G2 and G3 to serve as gate sidewall spacers 222a and 22b, as shown in FIG. 3D-1.

Figures 2, 3E:
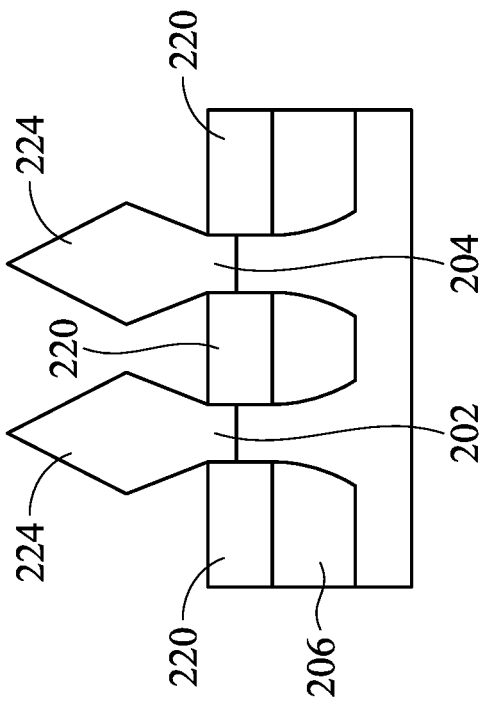
Figures 1, 3E:
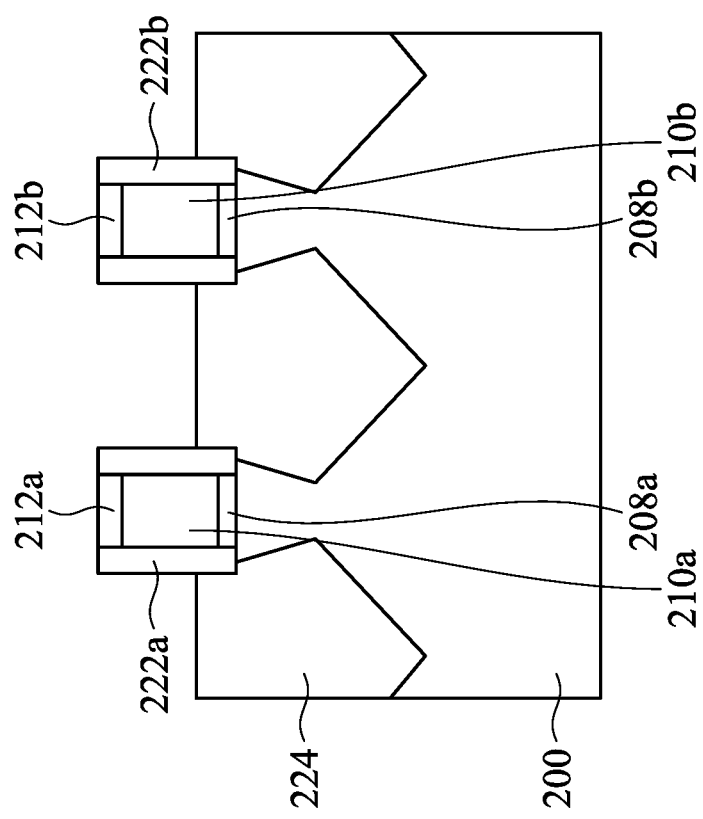

Afterwards, source/drain (S/D) structures 224 are formed over and/or in the semiconductor fins 202 and 204, as shown in FIGS. 3E-1 and 3E-2 in accordance with some embodiments. In some embodiments, the S/D structures 224 are formed on the semiconductor fin (e.g., the semiconductor fins 202 and 204) on opposite sides of the dummy gate stacks G2 and G3.

In some embodiments, portions of the semiconductor fins 202 and 204 adjacent to the dummy gate stacks G2 and G3 are recessed to form recesses, and strained materials are grown in the recesses by an epitaxial (epi) process to form the S/D structures 224. The materials and methods for forming the S/D structures 224 are the same as or similar to those for forming the S/D structures 131 of the above embodiments. In the interest of simplicity, the details will not be discussed again.

Afterwards, a contact etch stop layer (CESL) 226 is conformally deposited by any applicable process (e.g., a CVD process, an ALD process, another applicable deposition process, or a combination thereof) on surfaces of the S/D structures 224, sidewalls and top surfaces of the gate sidewall spacers 222a and 222b, top surfaces of the capping layers 212a and 212b, and top surfaces of the isolation structure 220. Generally, a contact etch stop layer can provide a mechanism to stop an etch process when forming, e.g., contacts holes or via holes. In some embodiments, the contact etch stop layer 226 includes silicon nitride, silicon carbon nitride, the like, or a combination thereof.

Figures 2, 3F:
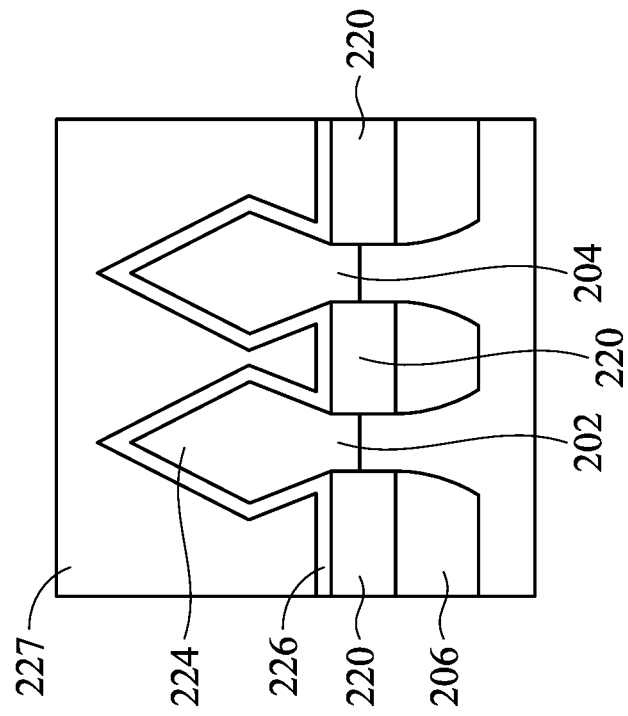
Figures 1, 3F:
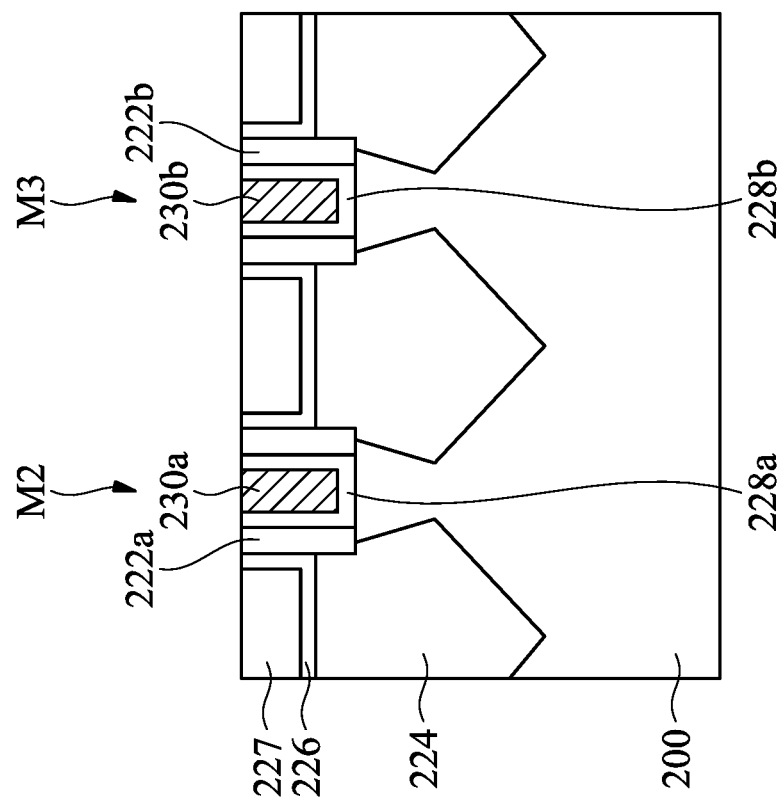

Afterwards, an interlayer dielectric (ILD) layer 227 is formed over the contact etch stop layer 226, as shown in FIGS. 3F-1 and 3F-2 in accordance with some embodiments. The ILD layer 227 may cover the semiconductor fins 202 and 204, as shown in FIGS. 3F-1 and 3F-2. The materials and the methods for forming the ILD layer 227 may be the same as or similar to those for forming the ILD layer 132 of the above embodiments. In the interest of simplicity, the details will not be discussed again.

Afterwards, a planarization process, such as a chemical mechanical polishing process, is performed to level the top surfaces of the ILD layer 227 and CESL 226 with the top surfaces of the dummy gate stacks G2 and G3, in accordance with some embodiments. The planarization process may also remove the capping layers 212a and 212b, and upper portions of the gate sidewall spacers 222a and 222b.

Afterwards, the dummy gate stacks G2 and G3 are removed to form trenches (or recesses) in the ILD layer 227, and gate stacks M2 and M3 are formed in the trenches to replace the dummy gate stacks G2 and G3, as shown in FIGS. 3F-1 in accordance with some embodiments. The gate stacks M2 and M3 may be the same as or similar to the gate stack M1 of the above embodiments. For example, similar to the gate stack M1, the gate stack M2 may include a gate dielectric layer 228a and a metal gate electrode layer 230a, and the gate stack M3 may include a gate dielectric layer 228b and a metal gate electrode layer 230b. The materials and the methods for forming the gate stacks M2 and M3 are the same as or similar to those for forming the gate stack M1 of the above embodiments. In the interest of simplicity, the details will not be discussed again.

Afterwards, an ILD layer 229 is formed on the ILD layer 227, as shown in FIGS. 3G-1 and 3G-2 in accordance with some embodiments. The materials and methods for forming the ILD layer 229 may be the same as or similar to those for forming the ILD layer 227. In the interest of simplicity, the details will not be discussed again.

Afterwards, source/drain (S/D) contact structures 234 are formed on the S/D structures 224, so as to form a semiconductor structure 30, as shown in FIGS. 3G-1 and 3G-2 in accordance with some embodiments. The materials and the methods for forming the S/D contact structures 234 may be the same as or similar to those for forming the S/D contact structures 142. In the interest of simplicity, the details will not be discussed again.

In some embodiments, silicide layers 232 are formed on the S/D structures 224, as shown in FIGS. 3G-1 and 3G-2. The silicide layers 232 may be formed by reacting upper portions of the S/D structures 224 with metal layers formed on the S/D structures 224. An annealing process may be performed to facilitate the reaction of the S/D structures 224 with the metal layers.

As described previously, in some embodiments, the first dielectric material 112 is formed on the semiconductor fins 102 and 104, and then the second dielectric material 116 is formed to fill the trench O1 between the semiconductor fins 102 and 104, and then the isolation structure 118 is formed by heating the first dielectric material 112 and the second dielectric material 116. The second dielectric material 116 may be a flowable dielectric material, so that the isolation structure 118 may have an improved gap-fill capability to fill the trench between the semiconductor fins 102 and 104.

As described previously, in some embodiments, the isolation structure 118 is formed from the first dielectric material 112 and the second dielectric material 116. The first dielectric material 112 may be formed in an atomic layer deposition process, and the second dielectric material 116 may be formed by a flowable chemical vapor deposition process, so that the isolation structure 118 may have both gap-fill capability (e.g., the isolation structure 118 fills the trench between the semiconductor fins 102 and 104) and conformal property (e.g., the isolation structure 118 conformally lines the trench between the semiconductor fins 104 and 106).

As described previously, in some embodiments, the dielectric material 214 is formed on the semiconductor fins 202 and 204, and then the dielectric material 218 is formed to fill the trench O6 between the semiconductor fins 202 and 204, and then the isolation structure 220 is formed by heating the dielectric material 214 and the dielectric material 218. The dielectric material 218 may be a flowable dielectric material, so that the isolation structure 220 may have an improved gap-fill capability to fill the trench between the semiconductor fins 202 and 204.

As described previously, in some embodiments, the isolation structure 220 is formed from the dielectric material 214 and the dielectric material 218. The dielectric material 214 may be formed using an atomic layer deposition process, and the dielectric material 218 may be formed using a flowable chemical vapor deposition process, so that the isolation structure 220 may have both gap-fill capability (e.g., the isolation structure 220 fills the trench between the semiconductor fins 202 and 204) and conformal property (e.g., the isolation structure 220 conformally lines the trench between the dummy gate stacks G2 and G3).

Embodiments of methods for forming semiconductor structures are provided. The method may include forming a first dielectric material on a first semiconductor fin and a second semiconductor fin, and forming a second dielectric material on the first dielectric material. Afterwards, an isolation structure may be formed by heating the first dielectric material and the second dielectric material. The second dielectric material may be a flowable dielectric material, so that the isolation structure formed by heating the first dielectric material and the second dielectric material may have an improved gap-fill capability to fill the trench between the first and the second semiconductor fins.

In some embodiments, a method for forming a semiconductor structure is provided. The method includes patterning a semiconductor substrate to form a first semiconductor fin and a second semiconductor fin adjacent to the first semiconductor fin, and depositing a first dielectric material on the first semiconductor fin and the second semiconductor fin on the semiconductor substrate using an atomic layer deposition process. There is a first trench between the first semiconductor fin and the second semiconductor fin. The method also includes filling the first trench with a flowable dielectric material, and heating the flowable dielectric material and the first dielectric material to form an isolation structure between the first semiconductor fin and the second semiconductor fin.

In some embodiments, a method for forming a semiconductor structure is provided. The method includes patterning a semiconductor substrate to form a first semiconductor fin and a second semiconductor fin adjacent to the first semiconductor fin, conformally forming a first dielectric material on the first semiconductor fin and the second semiconductor fin on the semiconductor substrate, and performing a flowable chemical vapor deposition process to form a second dielectric material to fill a first trench between the first semiconductor fin and the second semiconductor fin. The carbon content of the second dielectric material is lower than the carbon content of the first dielectric material. The method also includes performing an annealing process in an oxygen-containing atmosphere to convert the first dielectric material and the second dielectric material to a first isolation structure comprising oxide and surrounding the first semiconductor fin and the second semiconductor fin.

In some embodiments, a method for forming a semiconductor structure is provided. The method includes patterning a semiconductor substrate to form a first semiconductor fin and a second semiconductor fin adjacent to the first semiconductor fin, forming a first dielectric material on the first semiconductor fin and the second semiconductor fin on the semiconductor substrate using an atomic layer deposition process, forming a second dielectric material by a flowable chemical vapor deposition process to fill a first trench between the first semiconductor fin and the second semiconductor fin, and reacting the first dielectric material and the second dielectric material with oxygen to form a first isolation structure surrounding the first semiconductor fin and the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    patterning a semiconductor substrate to form a first semiconductor fin and a second semiconductor fin adjacent to the first semiconductor fin;
    depositing a first dielectric material on the first semiconductor fin and the second semiconductor fin on the semiconductor substrate using an atomic layer deposition process, wherein there is a first trench between the first semiconductor fin and the second semiconductor fin;
    filling the first trench with a flowable dielectric material;
    heating the flowable dielectric material and the first dielectric material to form an isolation structure between the first semiconductor fin and the second semiconductor fin;
    patterning the semiconductor substrate to form a third semiconductor fin, wherein the second semiconductor fin is between the first semiconductor fin and the third semiconductor fin, the first dielectric material is also deposited on the third semiconductor fin on the semiconductor substrate, there is a second trench between the second semiconductor fin and the third semiconductor fin, a first width of the first trench is smaller than a second width of the second trench, and a thickness of the flowable dielectric material in the first trench is greater than a thickness of the flowable dielectric material in the second trench;
    depositing a second dielectric material on the semiconductor substrate after the formation of the isolation structure;
    performing a planarization process to remove an upper portion of the second dielectric material to form a dielectric fin between the second semiconductor fin and the third semiconductor fin;
    etching back the isolation structure;
    forming a gate stack on the isolation structure and across the first semiconductor fin, the second semiconductor fin, the third semiconductor fin and the dielectric fin; and
    forming source/drain structures on the first semiconductor fin, the second semiconductor fin and the third semiconductor fin on opposite sides of the gate stack.

2. The method for forming a semiconductor structure as claimed in claim 1, wherein the flowable dielectric material has a viscosity in a range from about 0.1 centipoise to about 2 centipoise.

3. The method for forming a semiconductor structure as claimed in claim 1, wherein the flowable dielectric material has a dielectric constant in a range from about 2 to about 5.

4. The method for forming a semiconductor structure as claimed in claim 1, wherein a carbon content of the flowable dielectric material is lower than a carbon content of the first dielectric material.

5. The method for forming a semiconductor structure as claimed in claim 1, wherein the heating of the flowable dielectric material and the first dielectric material is performed in an oxygen-containing atmosphere and reduces a carbon content of the flowable dielectric material and a carbon content of the first dielectric material.

6. The method for forming a semiconductor structure as claimed in claim 1, wherein the heating of the flowable dielectric material and the first dielectric material is performed in an oxygen-containing atmosphere and reduces a nitrogen content of the first dielectric material and a nitrogen content of the flowable dielectric material.

7. The method for forming a semiconductor structure as claimed in claim 1, wherein an oxygen content of the isolation structure is greater than an oxygen content of the first dielectric material and an oxygen content of the flowable dielectric material.

8. The method for forming a semiconductor structure as claimed in claim 1, wherein the heating of the flowable dielectric material and the first dielectric material is performed is performed with an annealing temperature in a range from about 300° C. to about 500° C.

9. A method for forming a semiconductor structure, comprising:
    patterning a semiconductor substrate to form a first semiconductor fin and a second semiconductor fin adjacent to the first semiconductor fin;
    conformally forming a first dielectric material on the first semiconductor fin and the second semiconductor fin on the semiconductor substrate;
    performing a flowable chemical vapor deposition process to form a second dielectric material to fill a first trench between the first semiconductor fin and the second semiconductor fin, wherein a carbon content of the second dielectric material is lower than a carbon content of the first dielectric material;
    performing an annealing process in an oxygen-containing atmosphere to convert the first dielectric material and the second dielectric material to a first isolation structure comprising oxide and surrounding the first semiconductor fin and the second semiconductor fin;
    patterning the semiconductor substrate to form a third semiconductor fin, wherein the second semiconductor fin is between the first semiconductor fin and the third semiconductor fin, the first dielectric material is also deposited on the third semiconductor fin on the semiconductor substrate, there is a second trench between the second semiconductor fin and the third semiconductor fin, a first width of the first trench is smaller than a second width of the second trench, and a thickness of the second dielectric material in the first trench is greater than a thickness of the second dielectric material in the second trench;
    depositing a third dielectric material on the semiconductor substrate after the formation of the first isolation structure;
    performing a planarization process to remove an upper portion of the third dielectric material to form a dielectric fin between the second semiconductor fin and the third semiconductor fin;
    etching back the first isolation structure;
    forming a gate stack on the first isolation structure and across the first semiconductor fin, the second semiconductor fin, the third semiconductor fin and the dielectric fin; and
    forming source/drain structures on the first semiconductor fin, the second semiconductor fin and the third semiconductor fin on opposite sides of the gate stack.

10. The method for forming a semiconductor structure as claimed in claim 9, wherein an oxygen content of the first isolation structure is greater than an oxygen content of the first dielectric material and an oxygen content of the second dielectric material.

11. The method for forming a semiconductor structure as claimed in claim 9, wherein the annealing process is performed with an annealing temperature in a range from about 300° C. to about 500° C.

12. The method for forming a semiconductor structure as claimed in claim 9, wherein the annealing process is performed with an annealing time in a range from about 1800 seconds to about 10800 seconds.

13. The method for forming a semiconductor structure as claimed in claim 9, wherein the second dielectric material has a viscosity in a range from about 0.1 centipoise to about 2 centipoise.

14. The method for forming a semiconductor structure as claimed in claim 9, wherein the second dielectric material has a dielectric constant in a range from about 2 to about 5.

15. A method for forming a semiconductor structure, comprising:
   patterning a semiconductor substrate to form a first semiconductor fin and a second semiconductor fin adjacent to the first semiconductor fin;
   forming a first dielectric material on the first semiconductor fin and the second semiconductor fin on the semiconductor substrate using an atomic layer deposition process;
   forming a second dielectric material by a flowable chemical vapor deposition process to fill a first trench between the first semiconductor fin and the second semiconductor fin;
   reacting the first dielectric material and the second dielectric material with oxygen to form a first isolation structure surrounding the first semiconductor fin and the second semiconductor fin;
   patterning the semiconductor substrate to form a third semiconductor fin, wherein the second semiconductor fin is between the first semiconductor fin and the third semiconductor fin, the first dielectric material is also formed on the third semiconductor fin on the semiconductor substrate;
   depositing a third dielectric material on the first isolation structure; and
   performing a planarization process to remove an upper portion of the third dielectric material to form a dielectric fin between the second semiconductor fin and the third semiconductor fin, wherein a top surface of the dielectric fin is coplanar with a top surface of the first semiconductor fin after the planarization process is complete.

16. The method for forming a semiconductor structure as claimed in claim 15, wherein a carbon content of the second dielectric material is lower than a carbon content of the first dielectric material.

17. The method for forming a semiconductor structure as claimed in claim 15, wherein a carbon content of the first isolation structure is lower than a carbon content of the first dielectric material and a carbon content of the second dielectric material, and a nitrogen content of the first isolation structure is lower than a nitrogen content of the first dielectric material and a nitrogen content of the second dielectric material.

18. The method for forming a semiconductor structure as claimed in claim 15, further comprising:
   etching back the first isolation structure;
   forming a gate stack on the first isolation structure and across the first semiconductor fin, the second semiconductor fin, the third semiconductor fin and the dielectric fin; and
   forming source/drain structures over the first semiconductor fin, the second semiconductor fin and the third semiconductor fin at opposite sides of the gate stack.

19. The method for forming a semiconductor structure as claimed in claim 15, wherein the second dielectric material has a viscosity in a range from about 0.1 centipoise to about 2 centipoise.

20. The method for forming a semiconductor structure as claimed in claim 15, wherein the second dielectric material has a dielectric constant in a range from about 2 to about 5.

* * * * *